(12) United States Patent
Sohn et al.

(10) Patent No.: US 6,753,230 B2
(45) Date of Patent: Jun. 22, 2004

(54) METHOD FOR FABRICATING SEMICONDUCTOR DEVICE WITH ULTRA-SHALLOW SUPER-STEEP-RETROGRADE EPI-CHANNEL BY DECABORANE DOPING

(75) Inventors: Yong-Sun Sohn, Ichon-shi (KR); Sung-Jae Joo, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/330,087

(22) Filed: Dec. 30, 2002

(65) Prior Publication Data

US 2003/0215991 A1 Nov. 20, 2003

(30) Foreign Application Priority Data

May 18, 2002 (KR) ........................................ 2002-27616

(51) Int. Cl.[7] .............................................. H01L 22/336
(52) U.S. Cl. ....................... 438/289; 438/217; 438/231; 438/276; 438/303
(58) Field of Search ................................ 438/217, 229, 438/230, 231, 276, 275, 289, 291, 299, 303, 305

(56) References Cited

U.S. PATENT DOCUMENTS

| | | | |
|---|---|---|---|
| 5,124,272 A | * 6/1992 | Saito et al. .................. | 438/297 |
| 6,013,332 A | * 1/2000 | Goto et al. .................. | 427/530 |
| 6,228,725 B1 | * 5/2001 | Nandakumar et al. ...... | 438/289 |
| 6,277,718 B1 | * 8/2001 | Naganuma et al. .......... | 438/585 |
| 6,340,617 B1 | * 1/2002 | Goto .......................... | 438/303 |
| 6,365,475 B1 | * 4/2002 | Cheng et al. ................ | 438/306 |
| 6,380,013 B2 | * 4/2002 | Lee ............................. | 438/184 |
| 6,413,810 B1 | * 7/2002 | Matsuhashi ................. | 438/231 |
| 6,426,279 B1 | * 7/2002 | Huster et al. ................ | 438/528 |
| 6,444,550 B1 | * 9/2002 | Hao et al. .................... | 438/530 |

OTHER PUBLICATIONS

Jung–Ho Lee, et al.; "Laser Thermal Annealed SSR well Prior to Epi–channel Growth (LASPE) for 70 nm nFETs"; 2000 IEEE.

* cited by examiner

Primary Examiner—Kevin M. Picardat
(74) Attorney, Agent, or Firm—Jacobson Holman PLLC

(57) ABSTRACT

The present invention provides a method for fabricating a semiconductor device with ultra-shallow super-steep-retrograde epi-channel that is able to overcome limitedly useable energies and to enhance manufacturing productivity than using ultra low energy ion implantation technique that has disadvantage of difficulties to get the enough ion beam current as well as that of prolonged processing time. The inventive method includes the steps of: a method for fabricating a semiconductor device with ultra shallow super-steep-retrograde (hereinafter referred as to SSR) epi-channel, comprising the steps of: forming a channel doping layer below a surface of a semiconductor substrate by implanting decaborane; forming an epi-layer on the channel doping layer; forming sequentially a gate dielectric layer and a gate electrode on the epi-layer; forming source/drain extension areas shallower than the channel doping layer by being aligned at edges of the gate electrode; forming a spacers on lateral sides of the gate electrode; and forming source/drain areas deeper than the channel doping layer by being aligned at edges of the spacer through ion implantation onto the substrate.

20 Claims, 17 Drawing Sheets

METHOD FOR FABRICATING SEMICONDUCTOR DEVICE WITH ULTRA-SHALLOW SUPER-STEEP-RETROGRADE EPI-CHANNEL BY DECABORANE DOPING

FILED OF THE INVENTION

The present invention relates to a method for fabricating a semiconductor device; and, more particularly, to a method for fabricating a semiconductor device with ultra-shallow super-steep-retrograde epi-channel of which gate length is less than 100 nm.

DESCRIPTION OF RELATED ARTS

Generally, in such transistors as metal-oxide-semiconductor field effect transistor (MOSFET) or metal-insulator-semiconductor field effect transistor (MISFET), a surface area of a semiconductive substrate, allocated below a gate electrode and a gate oxide layer, functions to flow electric circuits via an electric field supplied to a source and/or a drain in a state of supplying a voltage to the gate electrode. Thus, this surface area is called as a channel.

Also, properties of the above transistors rely on a dopant concentration of a channel, and a precise doping of the channel is very important since the dopant concentration determines several properties such as a threshold voltage of the transistor ($V_T$), a drain current ($I_d$) and so forth.

In connection to techniques for precise doping of the channel, ion implantation techniques including a well ion implantation and a channel ion implantation (alias; a threshold-voltage-adjusting ion implantation) are commonly used. The ion implantation technique is capable of forming the channel in variously diverse structures. As examples of the possible channel structures, there are a flat channel structure that has a uniform channel doping concentration keeping in depth within it, the buried channel structure wherein the channel formation occurs in a certain depth and a retrograde channel structure, wherein the channel doping concentration increases in depth.

Among the above-mentioned channels, the retrograde channel is formed by using such heavy ions as indium ($I_n$), arsenic ($A_s$) and antimony ($S_b$) and so forth through heavy ion implantation techniques and is generally used for a highly functioned microprocessor of which the gate length is less than 0.2 μm. Also, the retrograde channel is applied to a highly functioned device having a property of a high driving current since the retrograde channel shows an effect of increasing a the surface mobility with decreasing the doping concentration of surface.

As a gate length has been decreased, a channel depth is required to become shallower. Thus, it is limited for applying the ion implantation technique to a channel of which depth is less than 50 nm.

In order to improve this limitation, an epi-channel structure had been suggested wherein the epi-channel is formed on a channel doping layer.

FIG. 1A is a view illustrating an epi-channel structure of a semiconductor device in accordance with the prior art.

As shown in FIG. 1A, a gate oxide layer 12 and a gate electrode 13 are formed on a substrate 11, and an epi-channel including an epi-layer 14 and a channel doping layer 15 is formed on the substrate 11 allocated below the gate oxide layer 12. On lateral sides of the epi-channel, a highly concentrated source/drain extension (hereinafter referred as SDE) 16 and a source/drain area 17 are formed as well.

However, it is impossible for the above described prior art to establish an improved on/off current targeted by the semiconductor device with the epi-channel structure since it is difficult to control the loss and the diffusion of dopants from the channel doping layer 15.

As shown in FIG. 1B, another approach has been proposed for establishing a step-like δ-doped epi-channel to solve the above problem of the prior art.

FIG. 1B is a diagram showing changes of a doping profile of the δ-doped epi-channel in accordance with a transient enhanced diffusion (hereinafter referred as to TED) or a thermal budget. Also, it is observed that the δ-doped profile is broadening because the step-like δ-doping profile of the epi-channel allocated below the gate oxide layer 12 is unable to maintain a preferable δ-doping profile due to the TED or the excessive thermal budget. Herein, the broadening of the δ-doping profile and the preferable δ-doping profile are expressed as P2 and P1 in FIG. 1B, and the gate oxide layer 12 is abbreviated as $G_{ox}$.

Accordingly, although a δ-doped epi-channel with doped and undoped epi-layers is formed, it is still limited to establish a δ-doped epi-channel of which depth is less than 30 nm as dopants are diffused due to the TED or the excessive thermal budget. The dopant profile after excessive diffusion of the δ-doped dopants are shown as D in FIG. 1B.

As one solution for this limitation, it is suggested to restrain the diffusion of the δ-doped epi-channel by instantaneously performing a laser thermal annealing (hereinafter referred as to LTA) process after forming the δ-doped channel doping layer 24 in FIG. 2A. With a required concentration through an ultra low energy ion implantation technique. FIGS. 2A and 2B are cross-sectional views illustrating the above described method.

With reference to FIGS. 2A and 2B, it is described a method of prior art for fabricating a semiconductor device with an epi-channel by the ultra low energy ion implantation and the LTA techniques.

Referring to FIG. 2A, P-type dopants are ion implanted on a substrate 21 formed with a field oxide layer 22 in a shallow trench isolation (STI) structure so as to form a deep P-type well 23. Subsequently, boron ions having about 1 keV of the ultra low energy are implanted thereto, forming a δ-doped channel doping layer 24.

Next, the LTA with a unit energy level ranging from about 0.36 J/cm² to about 0.44 J/cm² is directly performed without preceeding a pre-amorphization process for making a surface of the substrate 21 amorphous. FIG. 2B shows the result from a direct application of the LTA, in which boron ions are redistributed forming the resultant δ-doping layer 24A with the suppression of TED.

Referring to FIG. 2B, an epi-layer 25 is formed through a selective epitaxial growth (hereinafter referred as to SEG) on the channel doping layer 24A so as to form a super-steep-retrograde (hereinafter referred as to SSR) epi-channel structure. The thickness of above epi-layer 25 ranges from about 50 Å to about 300 Å, formed at a temperature ranging from about 600° C. to about 800° C. Meanwhile, it is also possible to suppress the TED of the δ-doped channel doping layer 24 through a rapid thermal annealing (hereinafter referred as to RTA) in addition to the LTA.

FIG. 3A is a graph showing a doping profile of the SSR epi-channel formed by the selective epitaxial growth on the sample doped with boron ions ($B^+$) in 1 keV, while FIG. 3B is a graph showing a doping profile of the SSR epi-channel formed by the selective epitaxial growth on the sample doped with boron ions ($B^+$) in 5 keV.

Referring to FIGS. 3A and 3B, with respect to the doping profile of the SSR epi-channel through the ultra low energy ion implantation, as lowering the ion implantation energy, a distribution range of the δ-doping becomes narrower, and this narrow distribution of the δ-doping can reduce significantly a junction capacitance of a semiconductor device. Also, it is possible to decrease the leakage currents of the junction, thereby ultimately manufacturing a semiconductor device with a low consumption of electricity and high efficiency. Therefore, this ultra low energy ion implantation technique is an essential technology to produce the above functioned semiconductor.

However, the ultra low energy ion implantation technique has a difficulty in extracting ion beams at the ultra low energy, and this difficulty results in limiting usable energies and in low productivity for establishing the doping profile for the SSR epi-channel.

SUMMARY OF THE INVENTION

It is, therefore, an object of the present invention to provide a method for fabricating semiconductor devices with epi-channel structure that overcome the limitations in useable energy and the decrease of productivity when employing a ultra low energy ion implantation technique which has a disadvantage in prolonged processing time.

In accordance with an aspect of the present invention, there is provided a method for fabricating a semiconductor device with ultra shallow super-steep-retrograde (hereinafter referred as to SSR) epi-channel, comprising the steps of: forming a channel doping layer below a surface of a semiconductor substrate by implanting decaborane; forming an epi-layer on the channel doping layer; forming sequentially a gate dielectric layer and a gate electrode on the epi-layer; forming source/drain extension areas shallower than the channel doping layer by being aligned at edges of the gate electrode; forming a spacers on lateral sides of the gate electrode; and forming source/drain areas deeper than the channel doping layer by being aligned at edges of the spacer through ion implantation onto the substrate.

In accordance with another aspect of the present invention, there is provide a method for fabricating a semiconductor device with ultra shallow super-steep-retrograde (hereinafter referred as to SSR) epi-channel, comprising the steps of: forming a well in semiconductive substrate; forming a first punch stop doping layer by implanting decaborane ions below a surface of above the well; performing a first annealing process at a temperature lower than a melting point of the substrate; forming an epi-layer on the punch stop doping layer; forming sequentially a gate dielectric layer and a gate electrode on the epi-layer; forming a first source/drain area aligning at both edges of the gate electrode; forming a second punch stop doping layer below the first source/drain area by implanting the same dopant in the well; forming a second source/drain area connected to the first source/drain area and deeper than the first source/drain area; and performing a second annealing process for the purpose of activation of dopants in the first and the second source/drain area at a temperature suppressing the diffusions of the channel doping layer.

In accordance with further aspect of the present invention, there is also provided a method for fabricating a semiconductor device with ultra shallow super-steep-retrograde (hereinafter referred as to SSR) epi-channel, comprising the steps of: forming a well in semiconductive substrate; forming a first punch stop doping layer by implanting decaborane ions below a surface of above the well; performing a first annealing process at a temperature lower than a melting point of the substrate; forming an epi-layer on the punch stop doping layer; forming sequentially a gate dielectric layer and a gate electrode on the epi-layer; forming a first source/drain area aligning at both edges of the gate electrode; forming a second punch stop doping layer below the first source/drain area by implanting the same dopant in the well; forming a second source/drain area connected to the first source/drain area and deeper than the first source/drain area; and performing a second annealing process for the purpose of activation of dopants in the first and the second source/drain area at a temperature suppressing the diffusions of the channel doping layer.

In addition, the formation of the well is followed by the step of forming a field stop doping layer, same dopant as the well at the depth close to the bottom of field Oxide. Selective epitaxial growth is performed on the second source/drain areas to form a third source/drain areas.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

In accordance with the present invention, there is provided a method for fabricating a semiconductor device with ultra-shallow super-steep-retrograde (hereinafter referred as to SSR) epi-channel. In comparison with low energy ion implantation technique, decaborane ion implantation technique reduces the distributional width of dopants and significantly improves productivity due to the reduced processing time. Hence, it is especially applied to an epi-channel doping so as to provide an ultra-shallow SSR epi-channel with enhanced properties as well as improving productivity.

Decaborane of which molecular formula is $B_{10}H_{14}$ is a source ion for the implantation for which the present invention is particularly applicable. Also, decaborane has large molecular weight and provides a boron ion including 10 boron atoms when ionized. Because of these chemical properties, decaborane is an excellent chemical mixture that can be used as a supplying source for implanting boron.

In particular, decaborane ion beam is able to implant boron ions per unit current ten times greater than a boron ion beam including one boron atom. Hence, it is appropriate to use the decaborane ion beam for an ion implantation process requiring low energy and high dosage when fabricating shallow junction.

Also, the decaborane ion beam, on the surface of a sample, where the molecules collide, is separated into each boron atoms with relatively $1/11$ of original decaborane ion beam energy. Thus, when the decaborane ion beam is set to be transmitted with 11 times greater than the boron ion beam energy, it is possible to obtain a nearly identical ion implantation depth as of performing ultra low energy boron ion implantation. Because of this characteristic, the decaborane ion beam can be used without a difficulty in extracting the low energy ion beam.

In case that the above described decaborane ($B_{10}H_{14}$) molecule is ionized into $B_{10}H_{14}^+$ and ion implanted with a large molecular weight as seen from the ionized formula, it is possible to form a very shallow doping layer of which depth is $1/11$ times less than that of the boron ion implantation.

Also, even if the accelerated energy higher than the energy used for the boron ion implantation is applied, it is still possible to form a much shallower doping layer. In addition, an implantation dose of the decaborane ions, $1/10^{th}$ less than the boron ion implantation, has the same effect of implanting the identical dose of boron onto the sample.

Figure 1A:
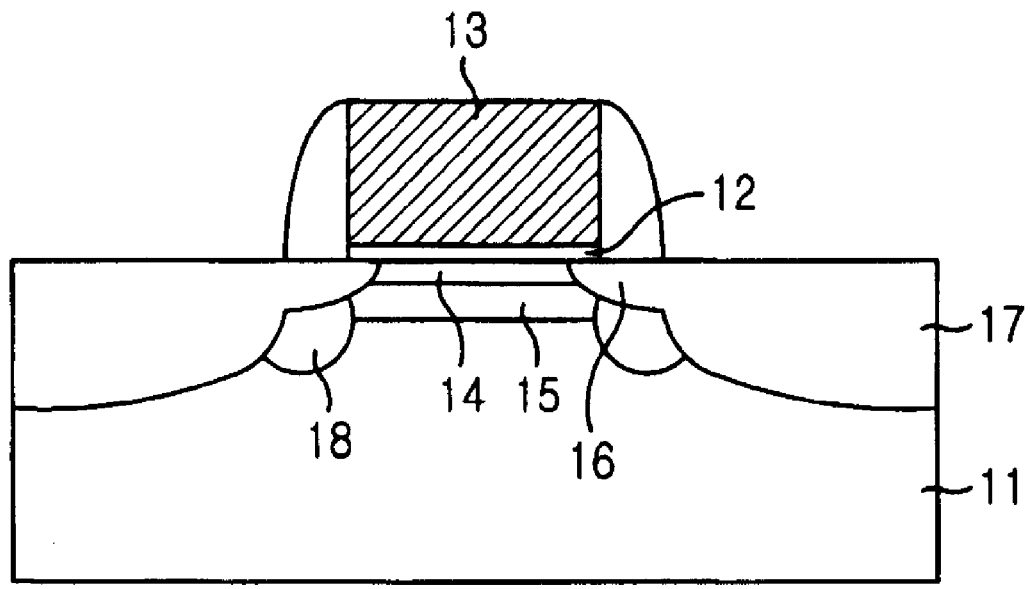
FIG. 1A is a view illustrating a typical semiconductor device with an epi-channel.
Figure 1B:
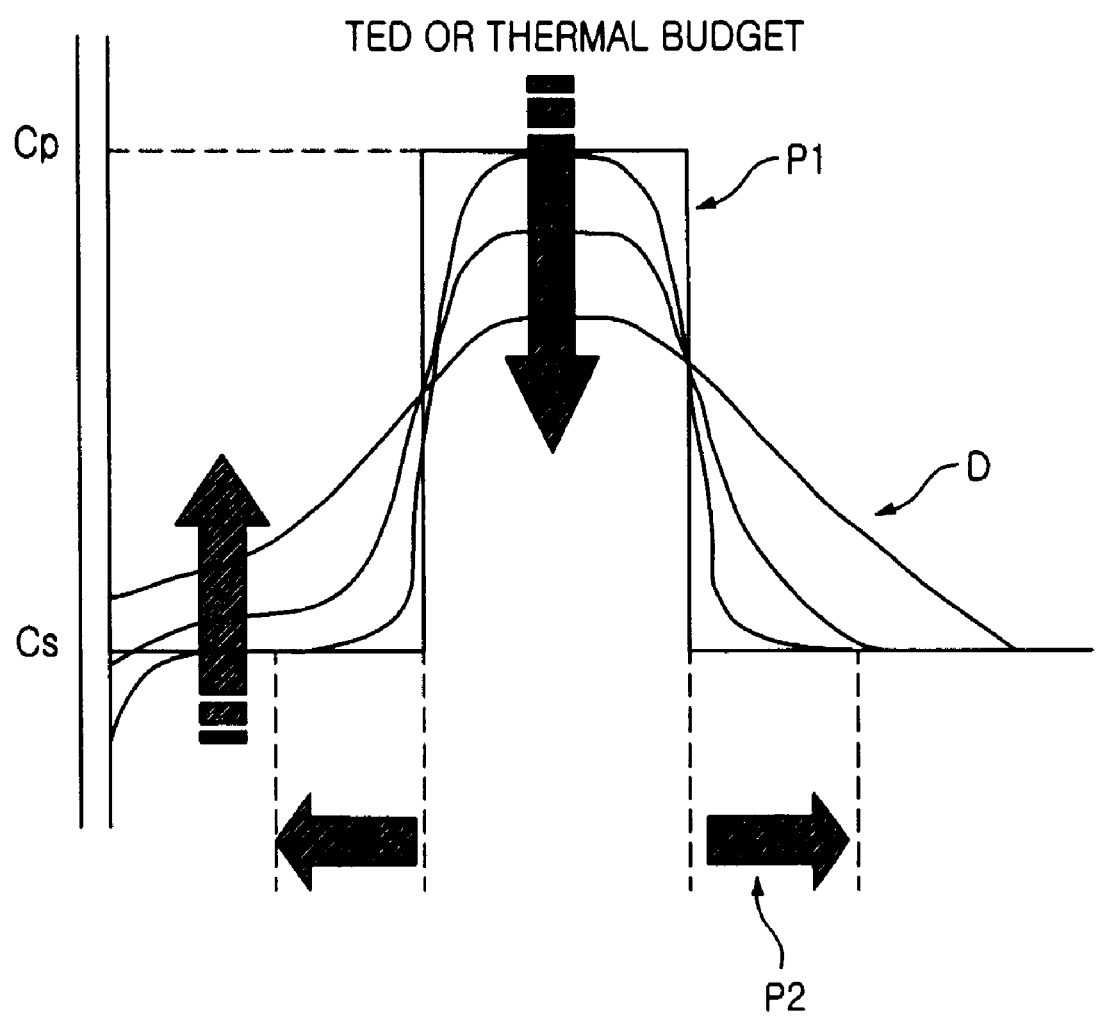
FIG. 1B is a diagram showing changes of a doping profile in an epi-channel in accordance with transient enhanced diffusion (TED) or accompanying thermal budget.
Figure 2A:
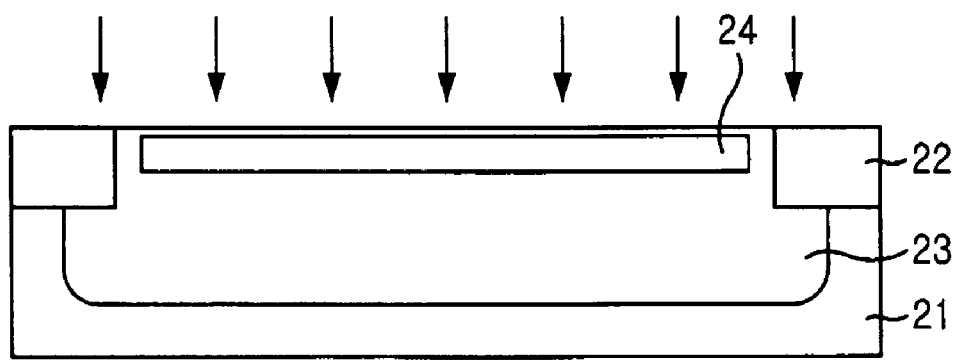
FIGS. 2A and 2B are views depicting a method for fabricating a semiconductor device with an epi-channel in accordance with ultra low energy ion implantation and laser thermal annealing (LTA)
Figure 2B:
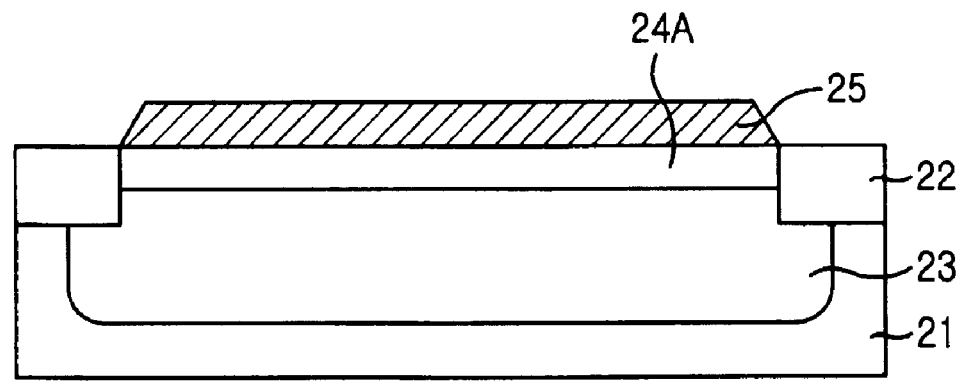
Figure 3A:
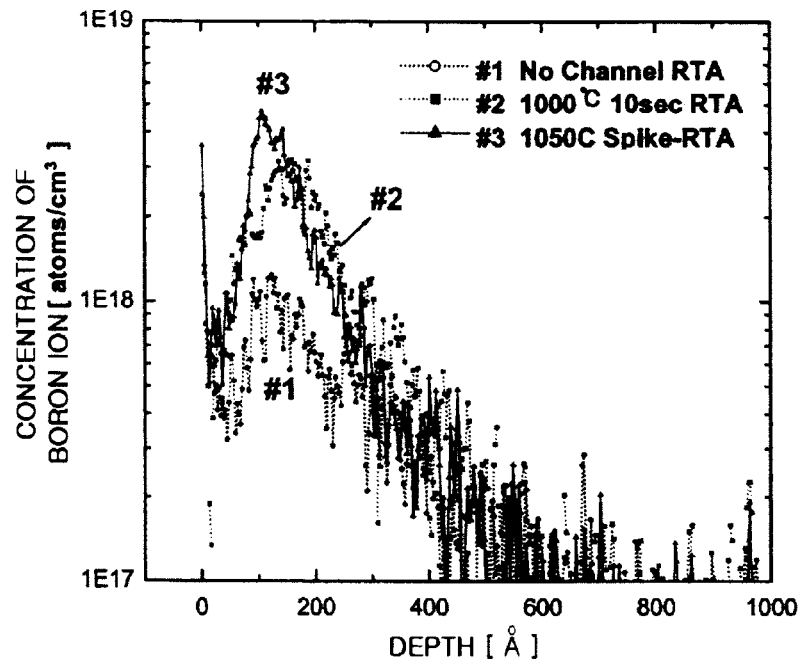
FIG. 3A is a graph showing super-steep-retrograde (SSR) epi-channel doping profiles formed by selective epitaxial growth on samples doped with boron ions in 1 keV.
Figure 3B:
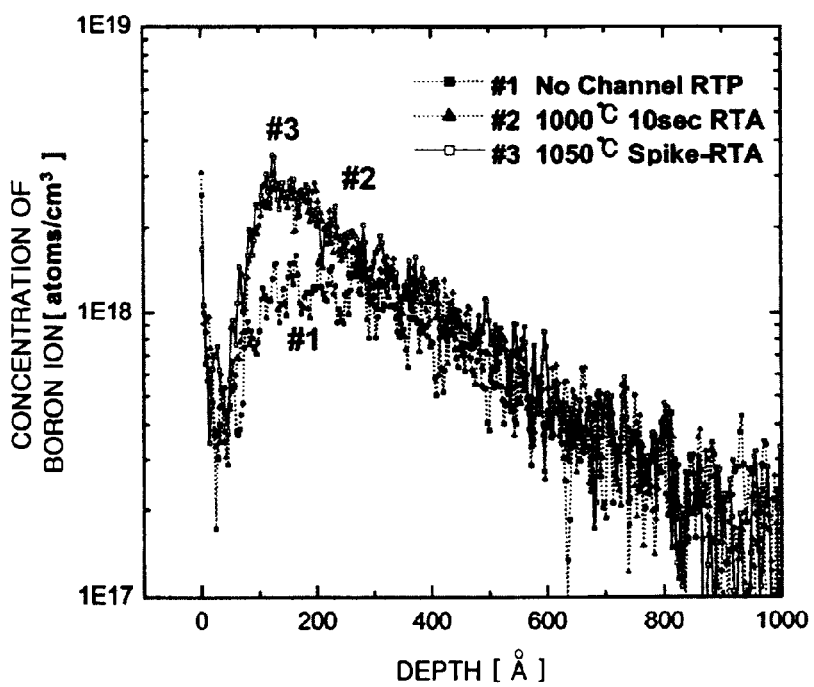
FIG. 3B is a graph showing super-steep-retrograde (SSR) epi-channel doping profiles formed by selective epitaxial growth on samples doped with boron ions in 5 keV.
Figure 4:
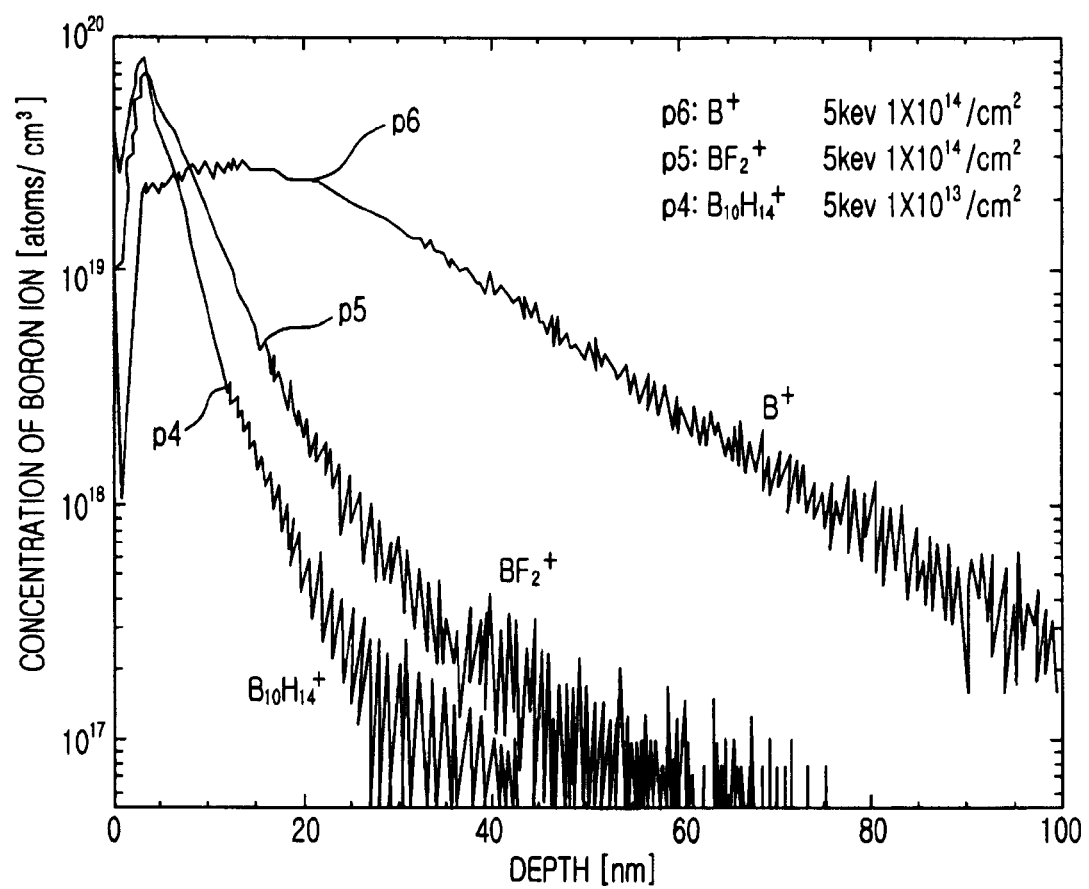
FIG. 4 is a graph showing distributions of boron ion concentrations when implanting boron difluoride ($BF_2^+$) and decaborane ions ($B_{10}H_{14}^+$) onto a substrate.

FIG. 4 is a graph showing distributions of the boron concentration when $B^+$, $BF_2^+$ and $B_{10}H_{14}^+$ ions are implanted onto the silicon substrate.

In FIG. 4, a horizontal coordinate and a vertical coordinate express a depth of the substrate and a concentration of boron, respectively. Curves denoted as P6, P5 and P4 represent cases of using $B^+$, $BF_2^+$ and $B_{10}H_{14}^+$ ions, respectively. Herein, the boron ion ($B^+$) implantation or $BF_2^+$ ion implantation are performed with the acceleration energy of 5 keV and a dose of $1\times10^{14}/cm^2$, while the ion implantation of $B_{10}H_{14}^+$ is performed with acceleration energy of 5 keV and a dose of $1\times10^{13}/cm^2$.

During the boron ion ($B^+$) implantation, the boron ions are implanted deeply into the substrate and its doping profile reaches a peak at a location deeper than 10 nm. In case of implanting $BF_2^+$ and $B_{10}H_{14}^+$ ions, their doping profiles reach the same peak at about 3 nm and a rapid decrease of the boron concentration is observed at much deeper locations.

Furthermore, doping profiles shown in the curves P6 and P5 have different decrease patterns. The doping profile of curve P6 shows a narrower distribution of boron concentrations, and the doping profile of curve P4 has a higher peak than the curve P5. This higher peak means that it is possible to obtain the same dose of boron even with $1/10$ less dose of $B_{10}H_{14}^+$ ions than $BF_2^+$ ions.

The $BF_2^+$ and $B_{10}H_{14}^+$ ions are implanted with the identical accelerated energy. Upon this condition, the $B_{10}H_{14}^+$ ion can be implanted much shallowly compared to the $BF_2^+$ ion implantation. Also, in case of implanting the boron into identical depths, the accelerated energy for the $B_{10}H_{14}^+$ ion can be set to be higher than that for the $BF_2^+$ ion.

Figure 5:
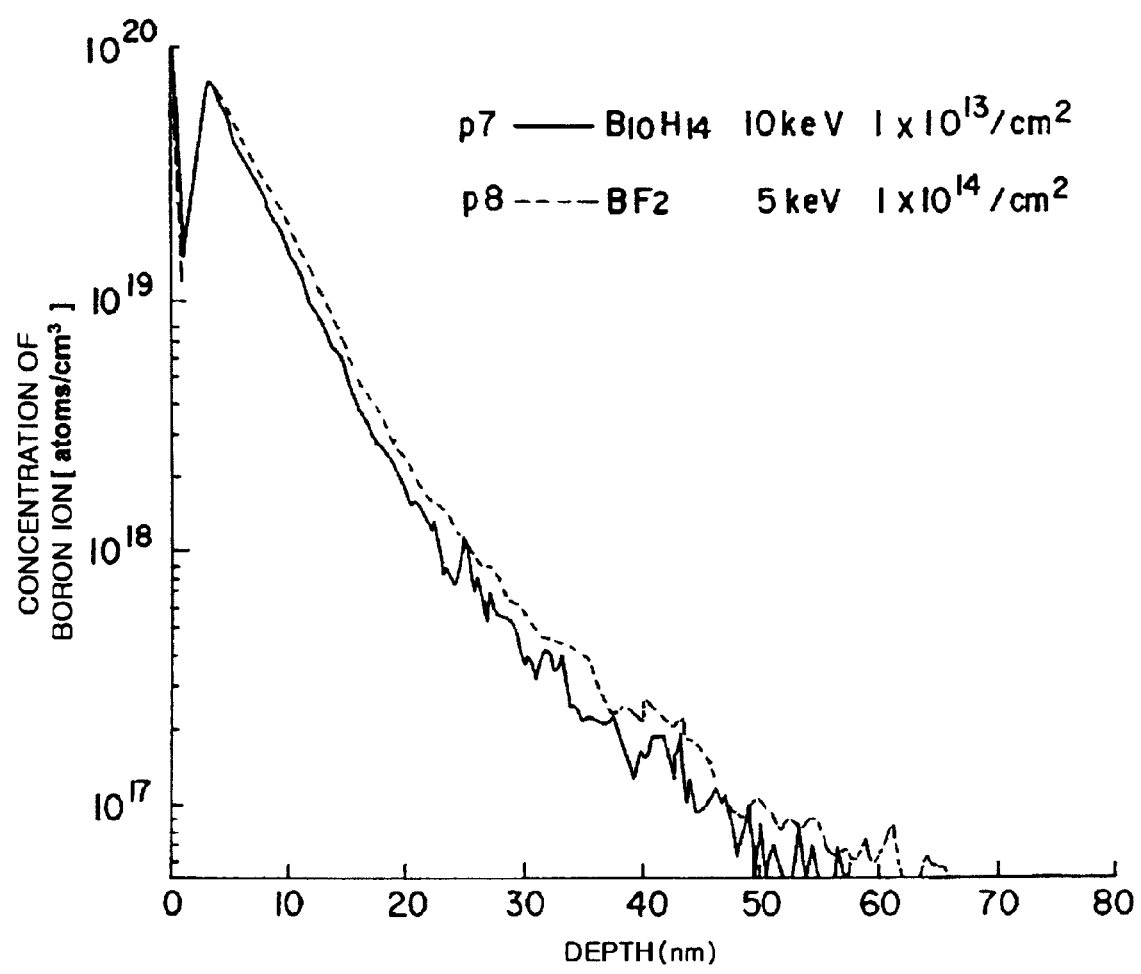
FIG. 5 is a graph showing distributions of boron ion concentrations when implanting $BF_2^+$ and $B_{10}H_{14}^+$ with nearly identical depths.

FIG. 5 is a graph showing an experimental result when implanting the $BF_2^+$ and $B_{10}H_{14}^+$ ions into nearly identical depths. In the graph, a horizontal coordinate and a vertical coordinate denote a depth of the substrate and a concentration of the boron, respectively. The curve P7 is a result of implanting the $B_{10}H_{14}^+$ ions with 10 KeV of the accelerated energy and $1\times10^{13}/cm^2$ of the dose concentration, whereas the curve P8 is a result of implanting the $BF_2^+$ ions with 5 keV of the accelerated energy and $1\times10^{14}/cm^2$ of the dose concentration. As shown in FIG. 5, the curves P7 and P8 have similar distributions. In other words, in case of ion implanting the boron with use of the $B_{10}H_{14}^+$ ions as an ion implantation source, the accelerated energy is twice of the ion implantation that uses the $BF_2^+$ ions as an ion implantation source.

As described above, $B_{10}H_{14}^+$ (hereinafter referred as to decaborane) ion is a very effective ion implantation source enabled with a ultra-shallow doping. Especially, compared to the ultra low energy ion implantation technique, the decaborane ion implantation has an advantage in its capability of the SSR doping having a narrow width when applied for the formation of the ultra-shallow SSR epi-channel, and thus, it enhances a function of a transistor with an ultra-shallow source and/or drain structure.

Hereinafter, a method for fabricating a semiconductor device through the use of the decaborane ion implantation technique will be described in detail with reference to the appended drawings.

FIGS. 6A to 6E are cross-sectional views illustrating a method for fabricating a n-metal-oxide-semiconductor filed effect transistor (hereinafter referred as to nMOSFET) in accordance with a first preferred embodiment of the present invention.

Figure 6A:
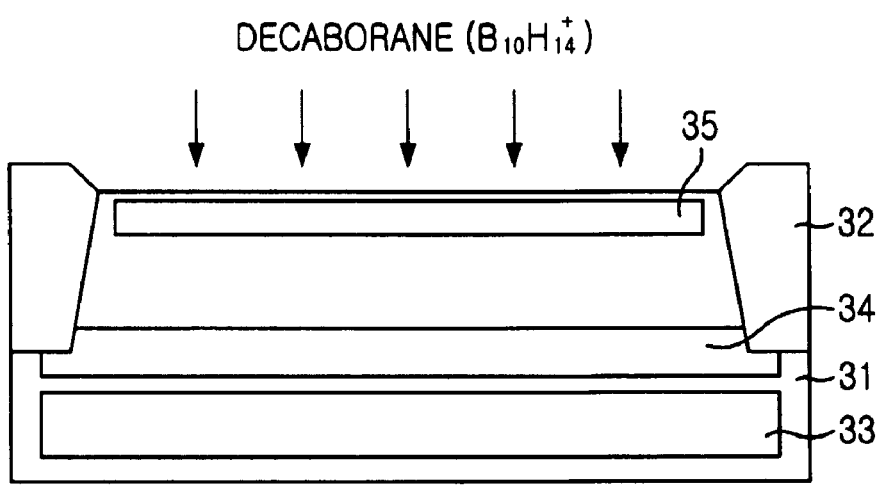
FIGS. 6A to 6E are cross-sectional views illustrating a method for fabricating an n-metal-oxide-semiconductor field effect transistor (nMOSFET) in accordance with a first preferred embodiment of the present invention.

Referring to FIG. 6A, a field oxide layer 32 for seperating a device from the adjacent one is formed on a predetermined position of a substrate 31 through a shallow trench isolation (hereinafter referred as to STI) process or a local oxidation of silicon (hereinafter referred as to LOCOS) process. After forming the field oxide layer 32, a p-type dopant is ion implanted on the substrate 31 so as to form a p-type well 33, and a p-type field stop layer 34 shallower than the p-type well 33 is formed by a continuous ion implantation of the p-type dopant. Herein, boron is used as a p-type dopant for forming the p-type well 33 and the p-type field stop layer 34.

Next, the decaborane ions are implanted as a p-type dopant so that a shallow p-type n-channel doping layer 35 is formed to a depth in a range from about 10 nm to about 50 nm measured from a surface of the substrate 31.

Figure 6B:
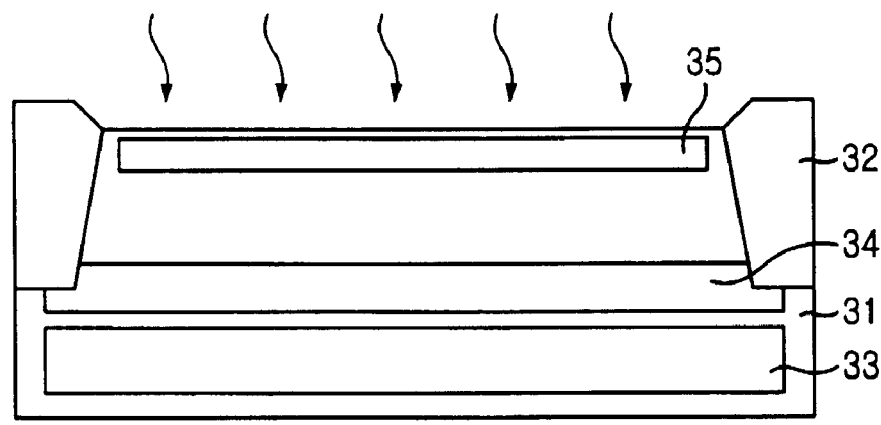

As illustrated in FIG. 6B, when implanting the decaborane ion for forming the p-type n-channel doping layer 35, such recovery annealing process as a rapid thermal annealing (hereinafter referred as to RTA) or a spike rapid thermal annealing (hereinafter referred as to SRTA) is performed at a temperature less than 1414° C. of the melting point of silicon. From this recovery annealing process, it is possible to recover the defects in crystals on the surface of the substrate 31 caused by ion bombardments and form stable bonds between the dopants implanted inside of the p-type n-channel doping layer 35 and silicon atoms located in the crystals so as to suppress the TED.

In this case, the SRTA is an annealing process that increases rapidly a temperature from a room temperature to a targeted temperature, and then, instantaneously decreases the temperature into the room temperature. In other words, the SRTA has a ramping rate greater than 150° C. per second and a delaying time is less than one second.

Preferably, the RTA or the SRTA is performed at a temperature in which the recovery of the defect in crystals is possible while maintaining a temperature lower than 1414° C., i.e., in a range from 950° C. to 1150° C.

Eventually, through the above recovery annealing process, the p-type n-channel doping layer 35 becomes a layer eliminated with the defects in crystals by forming the stable bonds between the implanted dopants and the silicon inside the substrate 31 as well as hydrogen of the decaborane is discharged during the recovery annealing process. As the results, the dopant, i.e., boron, and the silicon form a stable bond.

Next, after the recovery annealing process, a native oxide layer (not shown) generated on the p-type n-channel doping layer 35 is eliminated by performing a surface treatment process in an atmosphere of hydrogen. At this time, if the surface treatment process is operated in the atmosphere of hydrogen, the hydrogen ($H_2$) reacts with $SiO_2$, a native oxide layer, and gets evaporated as $H_2O$. As a result of the evaporation, the native oxide layer is eliminated. A proper temperature for the surface treatment process is a temperature that prevents diffusions of the dopants in the p-type n-channel doping layer 35.

Figure 6C:
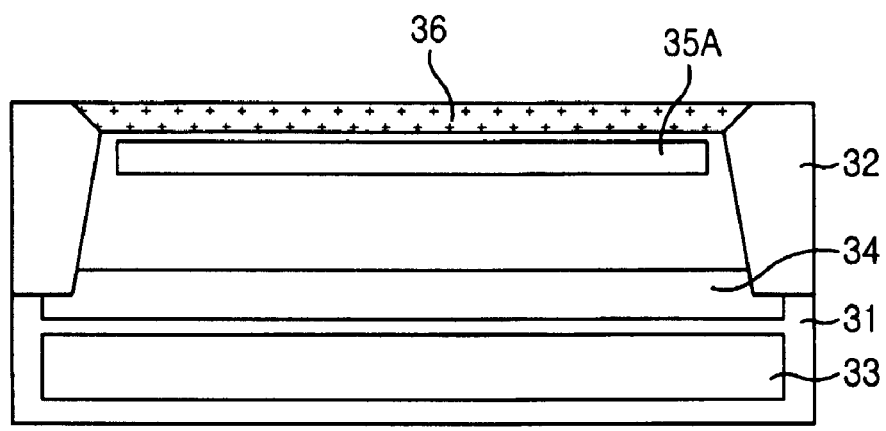

Referring to FIG. 6C, on the substrate 31 with the eliminated native oxide layer, preferably, on the p-type n-channel doping layer 35, an epi-layer 36 gets grown till having a thickness in a range from about 5 nm to about 30 nm through a selective epitaxial growth (hereinafter referred as to SEG).

As the p-type n-channel doping layer 35 is activated into an extensively shallow but chemically stable p-type n-channel doping layer 35A by the recovery annealing process as described above, it is possible to develop a SSR epi-channel structure possessing a doping profile that is minimized with losses and redistributions of the dopants during the surface process in the atmosphere of hydrogen and the SEG for forming the epi-layer 36.

Figure 6D:
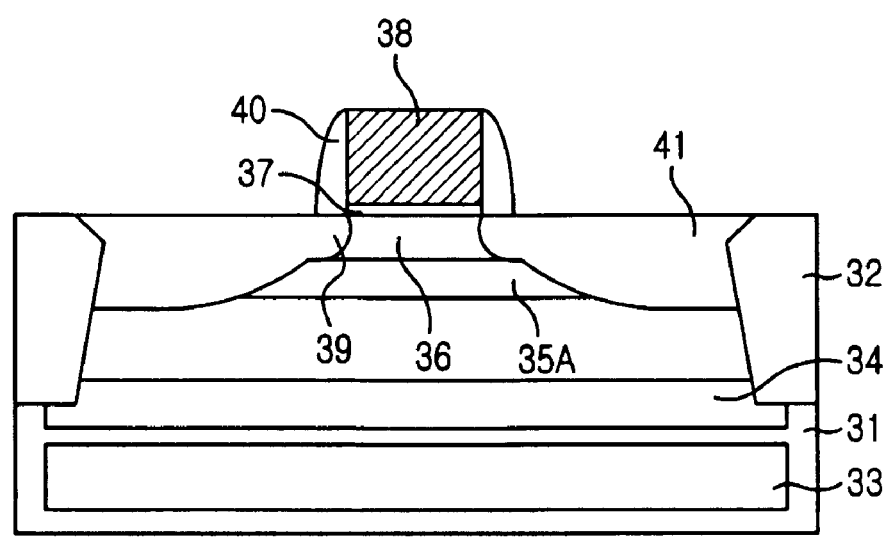

With reference to FIG. 6D, the SSR epi-channel structure, e.g., the p-type n-channel doping layer 35A formed through the decaborane ion implantation forms a gate dielectric layer 37 on the epi-layer 36 in a range of a temperature from about 650° C. to about 750° C. At this time, the temperature for forming the gate dielectric layer 37 is relatively in a low range to suppress distributions and diffusion of the dopants in the p-type n-channel doping layer 35A.

Also, a low temperature oxide (hereinafter referred as to LTO) layer formed at a relatively low temperature as the name indicates, a silicon oxynitride layer, a high-k dielectric layer or a stacked layer of an oxide layer and a high-k dielectric layer are used for the gate dielectric layer 37. During the formation of the gate dielectric layer 37, it is possible to suppress the redistributions and diffusion of the dopants in the p-type n-channel doping layer 35A so as to maintain the SSR doping profile by performing a low thermal budget process for forming the gate dielectric layer 37 at a relatively low temperature.

For instance, the silicon thermal oxide layer is formed at a temperature in a range from about 650° C. to about 750° C., and processed with a nitrogen plasma process or an ammonia plasma process so as to form the silicon oxynitride layer. Also, the high-k dielectric layer is formed through sequential successive processes of a deposition process carried out at a temperature in a range from about 300° C. to about 650° C. and a subsequent process for improving layer properties of the high-k dielectric layer selected from either a furnace annealing carried out at a temperature in a range from about 400° C. to about 700° C. or a rapid furnace annealing carried out at a temperature in a range from about 600° C. to about 800° C.

Then, on the gate dielectric 37, a conductive layer for forming a gate electrode 38 is deposited and patterned with a predetermined line width. After forming the gate electrode 38, an additional photosensitive film mask (not shown) and/or the gate electrode 38 is used as an ion implantation mask, and with a low energy, a high dose concentration of an n-type dopant is ion implanted to form a $n^+$ source/drain extension area 39.

Herein, the conductive layer for forming the gate electrode 38 can be a polysilicon layer, a stacked layer of polysilicon and metal layers or a stacked layer of polysilicon and silicide layers. The n-type dopant for forming the $n^+$ source/drain extension area 39 uses phosphorous (P) or arsenic (AS).

After depositing an insulation layer for forming a spacer 40 on a whole surface including the gate electrode 38, an etchback process is performed onto the insulation layer so as to form the spacer 40 on lateral sides of the gate electrode 38. In this case, the spacer 40 uses a nitride layer and/or an oxide layer.

Next, using the additional photosensitive film mask and/or the gate electrode 38 and the spacer 40 as another ion implantation mask, n-type dopants are ion implanted with a high dosage so as to form a $n^+$ source/drain area 41 that is electrically connected to the $n^+$ source/drain extension area 39. At this time, an ion implantation depth of the $n^+$ source/drain area 41 is deeper than that of the $n^+$ source/drain extension area 39.

Figure 6E:
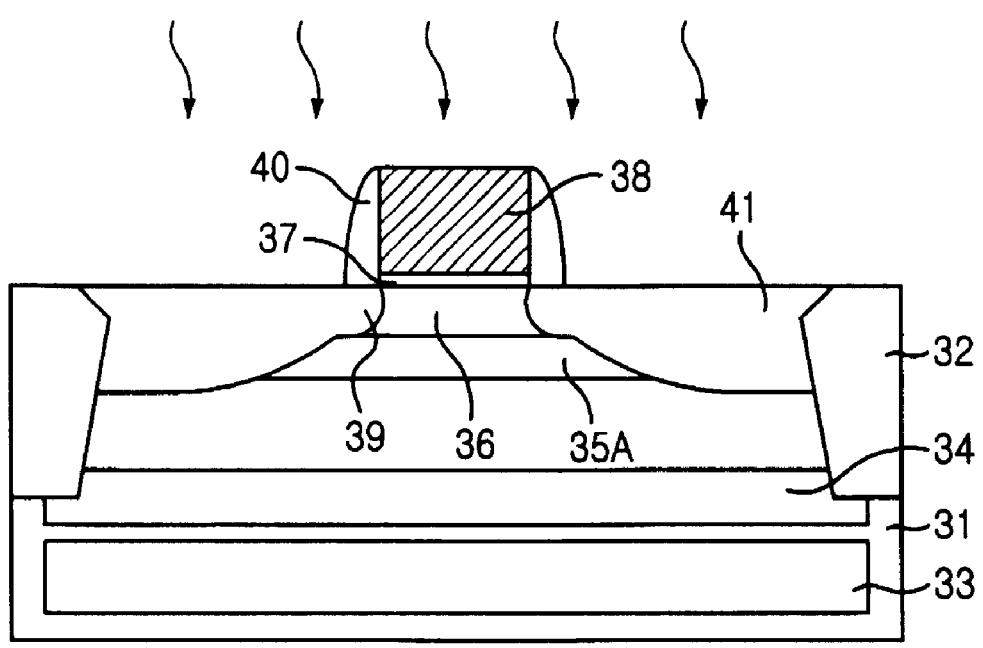

Referring to FIG. 6E, an activation annealing process is employed to electrically activate the dopants of the $n^+$ source/drain area 41 and the $n^+$ source/drain extension area 39. The activation annealing process is particularly operated at a specific temperature wherein a diffusion of the p-type n-channel doping layer 35A and a deepening of a junction depth of the $n^+$ source/drain area 41 and the $n^+$ source/drain extension area 39 can be simultaneously controlled.

Preferably, the activation annealing process is selected among the RTA, the furnace annealing or the SRTA wherein each conditional temperature for the process proceeding is set in a range from about 600° C. to about 1000° C., from about 300° C. to about 750° C. and from about 600° C. to about 1100° C., respectively.

In the meantime, if the processes for forming the gate electrode 38 and the n⁺ source/drain area 41 are proceeded through a low thermal budget process, it is possible to maintain the SSR epi-channel structure with restrained diffusions of the dopant.

In the preferred embodiment as explained above, the p-type n-channel doping layer 35A simultaneously functions as a punch stop layer for suppressing a short channel effect. Also, a maximum doping depth of the p-type n-channel doping layer 35A is set to be lower than a junction depth of the n⁺ source/drain area 41, thereby decreasing junction leakage currents and a junction capacitance with respect to a n⁺-p junction.

FIGS. 7A to 7F are cross-sectional views illustrating a method for fabricating a C-metal-oxide-semiconductor field effect transistor (hereinafter referred as to CMOSFET) in accordance with a second preferred embodiment.

Figure 7A:
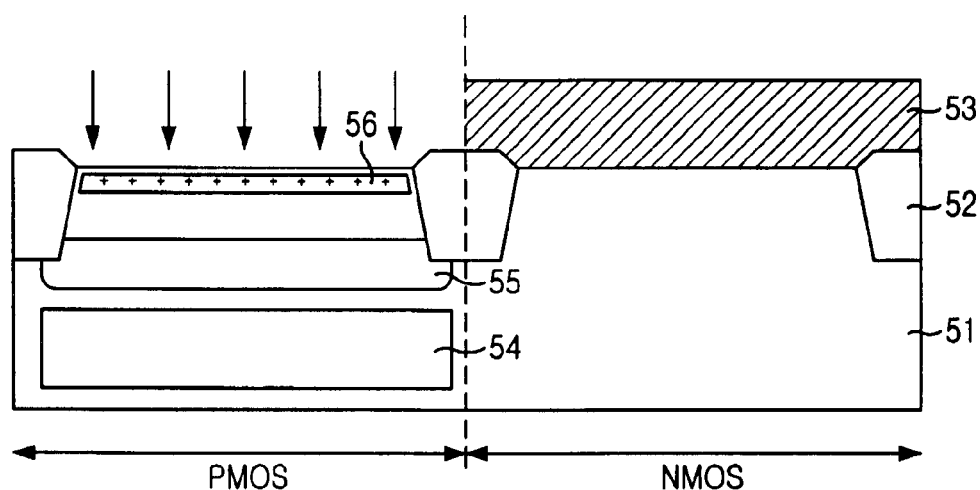
FIGS. 7A to 7F are cross-sectional views illustrating a method for fabricating a complementary metal-oxide-semiconductor field effect transistor (CMOSFET) in accordance with a second preferred embodiment of the present invention.

With reference to FIG. 7A, a field oxide layer 52 for segregating a device is formed on a preset place of a substrate 51 through the STI process or the LOCOS process. After forming the field oxide layer 52, a photosensitive film is coated on the substrate 51 and patterned with a photo exposure and a developing processes so that a first mask 53 is formed. The first mask 53 exposes an area where a pMOSFET of the substrate 51 will be subsequently formed. Hereinafter, this area will be abbreviated as to PMOS area.

Continuously, a deep n-type well 54 is formed by implanting the n-type dopant to the area of the substrate 51 exposed by the first mask 53. Then, the n-type dopant is consecutively implanted to form an n-type field stop layer 55 shallower than the n-type well 54.

As a next step, the n-type dopant is ion implanted with energy lower than the ion implantation energy for forming the n-type field stop layer 55 so to form a shallow n-type p-channel doping layer 56 having a thickness in a range from about 10 nm to about 50 nm measured from a surface of the substrate 51.

In addition, the n-type dopant uses phosphorous (P) or arsenic (AS).

Figure 7B:
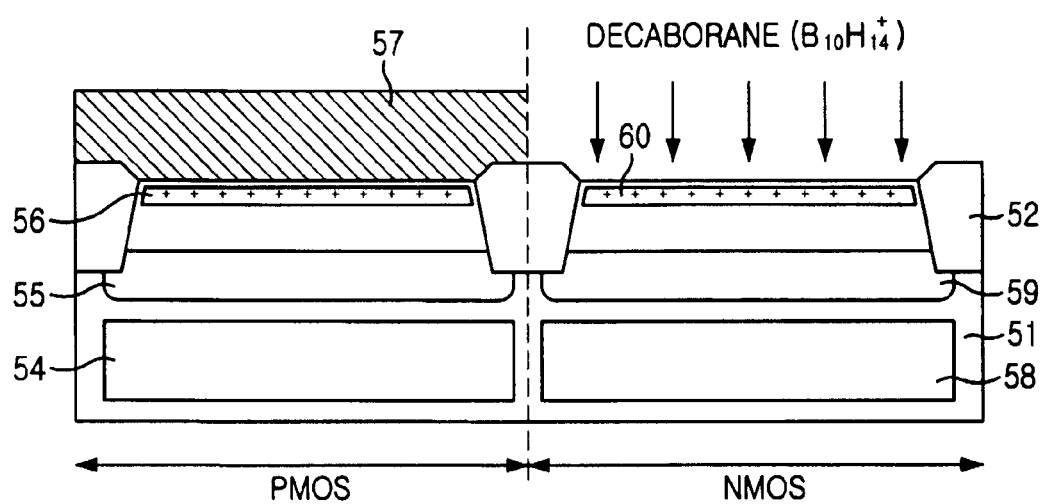

As clearly illustrated in FIG. 7B, after removing the first mask 53, a photosensitive film is coated again and patterned through the photo exposure and the developing processes so as to form a second mask 57. The second mask 57 exposes an area where an nMOSFET of the substrate 51 will be subsequently formed, and hereinafter, this area will be abbreviated as to nMOS area.

Subsequently, the p-type dopant is ion implanted onto the area of the substrate 51 exposed by the second mask 57 so to form a deep p-type well 58, which is, in turn, followed by a formation of a p-type field stop layer 59 shallower than the p-type well 58.

Then, the decaborane ions are implanted to form an extensively shallow p-type n-channel doping layer 60 of which depth is in a range from about 10 nm to about 50 nm measured from the surface of the substrate 51.

Figure 7C:
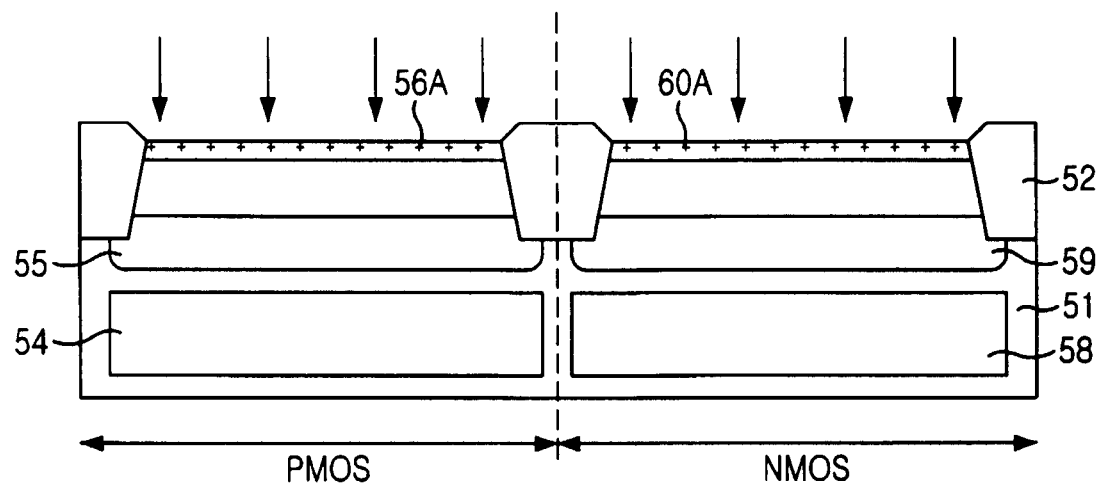

With reference to FIG. 7C, the second mask 57 is also removed and the recovery annealing process such as RTA or SRTA is performed at a temperature lower than a melting point of silicon, i.e., 1414° C. to recover a defect in crystals of the substrate 51 caused by ion bombardments that occur during the ion implantation for forming the n-type p-channel doping layer 56 and the p-type n-channel doping layer 60 and to allow the implanted dopants to bond stably with silicon atoms as simultaneously as to maximally restrain diffusions of the dopant.

Preferably, the RTA or the SRTA process is proceeded at a temperature in a range from about 950° .C to about 1150° C. This range of the temperature is lower than the melting point of silicon, yet is able to recover the defect in crystals.

Eventually, the n-type n-channel doping layer 56 and the p-type n-channel doping layer 60 is changed into a layer recovered with the defect in crystals by forming stable bonds between the ion implanted dopants and the silicon atoms in the substrate 51. Hereinafter, the changed n-type p-channel doping layer 56 and the p-type n-channel doping layer 60 are denoted as 56A and 60A, respectively.

After the recovery annealing process, a surface treatment process is performed on the n-type p-channel doping layer 56A and the p-type n-channel doping layer 60A in an atmosphere of hydrogen to remove a native oxide layer (not shown) generated during the recovery annealing process. At this time, in case of performing the surface process in the atmosphere of hydrogen, hydrogen ($H_2$) reacts with the native oxide layer ($SiO_2$) and is evaporated as $H_2O$, thereby eliminating the native oxide layer.

Figure 7D:
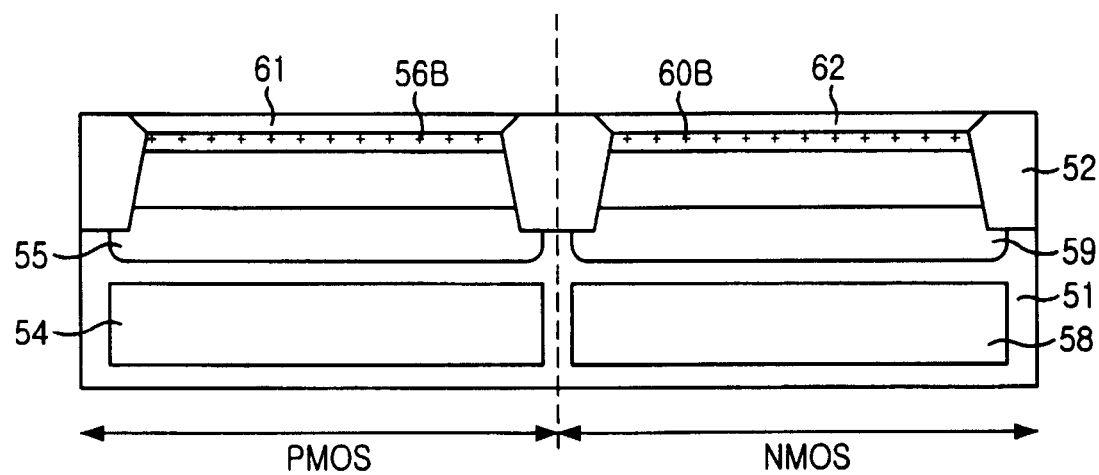

Referring to FIG. 7D, on the substrate 51 removed with the native oxide layer, preferably on the n-type p-channel doping layer 56A and p-type n-channel doping layer 60A, epi-layers 61 and 62 get grown through the SEG technique until having a thickness in a range from about 5 nm to about 30 nm.

As the n-type p-channel doping layer 56A and the p-type n-channel doping layer 60A are activated into an n-type p-channel doping layer 56B and a p-type n-channel doping layer 60B through the recovery annealing process. Both n-type p-channel doping layer 56B and p-type n-channel doping layer 60B are chemically stable and extensively shallow. Because of this activation, during the surface process in the atmosphere of hydrogen and the SEG for the epi-layers 61 and 62, it is possible to establish the SSR epi-channel structure having minimum losses and diffusions of the dopants on each nMOS area and pMOS area.

Figure 7E:
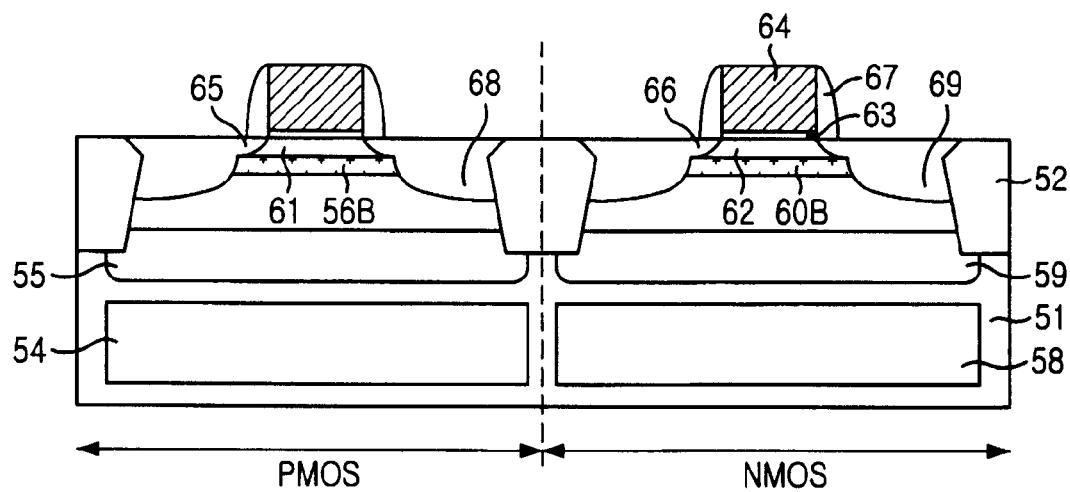

With reference to FIG. 7E, the SSR epi-channel structure, e.g., a gate dielectric layer 63 is formed on the n-type p-channel doping layer 56B and the p-type n-channel doping layer 60B at a temperature in a range from about 650° C. to about 750° C. At this time, the temperature for forming the gate dielectric layer 63 is relatively lower in order to restrain the diffusions of the dopant in the p-type n-channel doping layer 60B.

To achieve this targeted outcome, the gate dielectric layer 63 uses a LTO layer, a silicon oxynitride layer, a high-k dielectric layer or a stacked layer of an oxide layer and a high-k dielectric layer. As performing the low thermal budget process during the formation of the gate dielectric layer 63, the redistributions and diffusions of the dopant in the p-type n-channel doping layer 60B are restrained, thereby maintaining the SSR doping profile.

For instance, a silicon thermal oxide layer is formed at a temperature in a range from about 650° C. to about 750° C., and processed with a nitrogen plasma process or an ammonia plasma process so as to form a silicon oxynitride layer. Also, the high-k dielectric layer is formed through sequential successive processes of a deposition process carried out at a temperature in a range from about 300° C. to about 650° C. and a subsequent process selected from either a furnace annealing carried out at a temperature in a range from about 400 C. to about 700° C. or a rapid furnace annealing carried out at a temperature in a range from about 600° C. to about 800° C. In case of using the high-k dielectric layer, a maximum temperature is limited to be in a range from about 300° C. to about 700° C. when performing a thermal process for improving layer properties of the high-k dielectric layer.

Then, on the gate dielectric layer 63, a conductive layer for forming a gate electrode 64 is deposited and patterned with a predetermined line width to form a gate electrode 64. After forming the gate electrode 64, an additional photosensitive film mask (not shown) or the gate electrode 64 is used as an ion implantation mask. A high dose concentration of a p-type dopant ($p^+$) with a low energy is implanted onto the pMOS area to form a $p^+$ source/drain extension area 65 and a high dose concentration of an n-type dopant ($n^+$) with a low energy is implanted to form an $n^+$ source/drain extension area 66.

Herein, a conductive layer for forming the gate electrode 64 can be a polysilicon layer, a stacked layer of polysilicon and metal layers or a stacked layer of the polysilicon and silicide layers. The n-type dopant for forming the $n^+$ source/drain extension area 66 uses phosphorous (P) or arsenic (As), whereas the p-type dopant uses boron or boron mixture ions such as boron difluoride ($BF_2$).

Next, an insulation layer for forming a spacer 67 is deposited on a whole surface including the gate electrode 64, and then, an etchback process is applied to the insulation layer so as to form the spacer 67 positioned on lateral sides of the gate electrode 64. Herein, the spacer 67 uses a nitride layer or an oxide layer.

After forming the spacer 67, a high dose concentration of the p-type dopant such as boron or boron difluoride is implanted on the pMOS area through the ion implantation mask which uses an additional photosensitive film mask or the gate electrode 64 and the spacer 67 so that a $p^+$ source/drain area 68 is formed and electrically connected to the $p^+$ source/drain extension area 65. Also, the n-type dopant, e.g., P or As is implanted to form a $n^+$ source/drain area 69 electrically connected to the $n^+$ source/drain extension area 66. At this time, the $n^+$ source/drain area 69 and $p^+$ source/drain area 68 have deeper ion implantation depths than the n+ source/drain extension area 66 and p+ source/drain extension area 65, respectively.

Figure 7F:
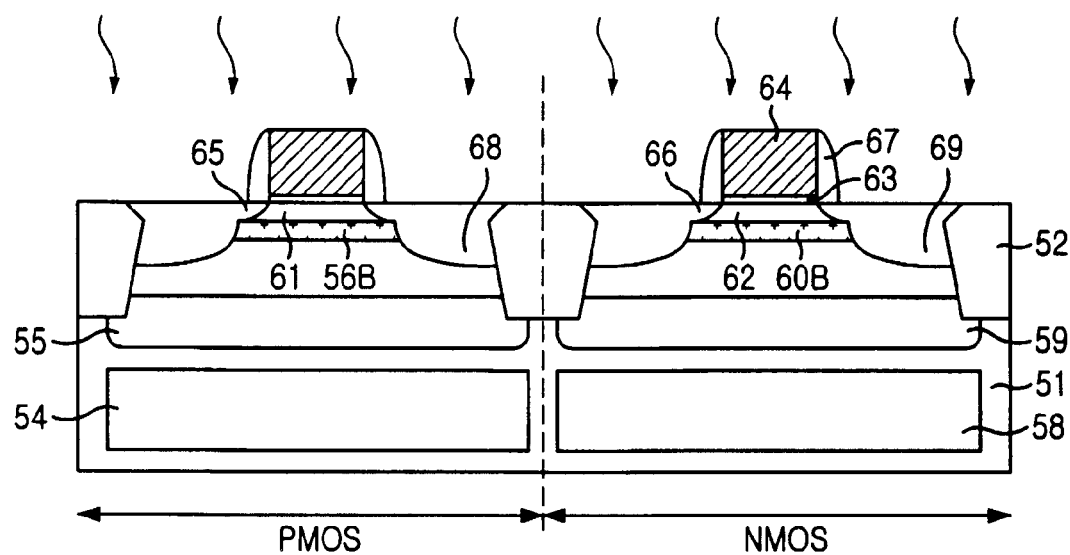

As shown in FIG. 7F, an activation annealing process is performed to electrically activate the dopants of the $n^+$ source/drain area 69, the $n^+$ source/drain extension area 66, the $p^+$ source/drain area 68 and the $p^+$ source/drain extension area 65.

At this time, the active annealing process is performed especially at a temperature where diffusions of the p-type n-channel doping layer 60B and a deepening of a junction depth of the $p^+$ source/drain area 68 and the $p^+$ source/drain extension area 65 are restrained simultaneously.

Meanwhile, the reason for performing the activation annealing process at a specific temperature, wherein the deepening of the junction depth of the $p^+$ source/drain area 68 and the $p^+$ source/drain extension area 65 is restrained because the $p^+$ source/drain area 68 and the $p^+$ source/drain extension area 65 has a higher degree of variations in diffusion compared to the n+ source/drain area 69 and the n+ source/drain extension area 66.

It is preferable for the activation annealing process to be selected among the RTA, the furnace annealing or the SRTA wherein each conditional temperature for the process proceeding is set in a range from about 600° C. to about 1000° C., from about 300° C. to about 750° C. and from about 600° C. to about 1100° C., respectively.

In the meantime, if processes for forming the gate electrode 64, the $p^+$ source/drain extension area 65, the $n^+$ source/drain extension area 66, the $p^+$ source/drain extension area 68 and the $n^+$ source/drain area 69 are proceeded through a low thermal budget process, it is possible to maintain the SSR epi-channel structure with restrained diffusions of the dopants.

In the second preferred embodiment, the n-type p-channel doping layer 56B and the p-type n-channel doping layer 60B simultaneously function as a punch stop layer for suppressing a short channel effect. Also, maximum doping depths of the n-type p-channel doping layer 56B and the p-type n-channel doping layer 60B are set to be lower than junction depths of the $p^+$ source/drain area 68 and the $n^+$ source/drain area 69, respectively. As a result, each junction capacitance with respect to the $p^+$-n and the $n^+$-p junctions and junction leakage currents are decreased.

Figure 8:
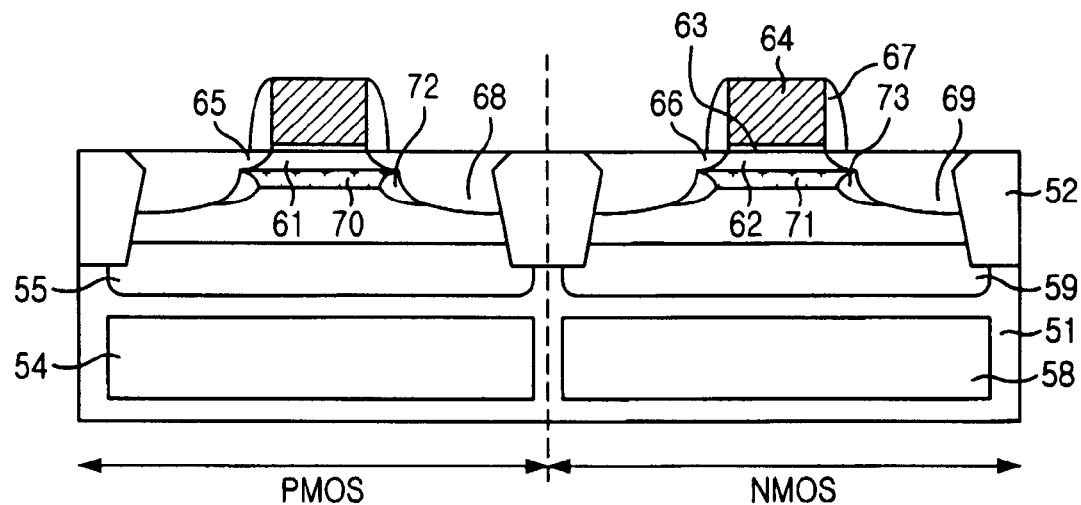
FIG. 8 is a cross-sectional view of the CMOSFET in accordance with a third preferred embodiment of the present invention.

FIG. 8 is a cross-sectional view showing a structure of the CMOSFET in accordance with a third preferred embodiment of the present invention. The structure of the CMOSFET in FIG. 8 is basically identical to the structure explained in the second preferred embodiment except for a first n-type punch stop layer 70, a second n-type punch stop layer 72, a first p-type punch stop layer 71 and a second p-type punch stop 73. Hereinafter, the same reference numerals used in FIG. 7F are applicable for FIG. 8 in accordance with the third preferred embodiment, and detailed descriptions on the identical parts will be omitted.

As similar to the second preferred embodiment, in the pMOS area, the epi-channel structure is established with the first n-type punch stop layer 70 ion implanted with P or As and the epi-layer 61 gets grown on the first n-type punch stop layer 70. Also, in the nMOS area, the first p-type punch stop layer 71 ion implanted with the decaborane and the epi-layer 62 gets grown on the first p-type punch stop layer 71.

Additionally, on a bottom portion of the p+ source/drain extension area 65 and the n+ source/drain extension area 66, the second n-type punch stop layer 72 and the second p-type punch stop layer 73 are formed, respectively. At this time, the second n-type punch stop layer 72 is formed by implanting the same n-type dopant, e.g., P or As for the first n-type punch stop layer 70, and the second p-type punch stop layer 73 is formed by implanting boron or boron mixture ions unlike to the first p-type punch stop layer 71 implanted with the decaborane ions.

Herein, the dopants are implanted prior to forming the p+ source/drain area 68 and the n+ source/drain area 69 to form the second n-type punch stop layer 72 and the second p-type punch stop layer 73 on a bottom portion of the p+ source/drain extension area 65 and the n+ source/drain extension area 66, respectively.

The second p-type punch stop layer 73 and the second n-type punch stop layer 72 function simultaneously as a channel doping layer in addition to a function as a punch stop layer for suppressing a short channel effect.

Eventually, the CMOSFET has a structure of double punch stop layers in accordance with the third preferred embodiment. The CMOSFET with the structure of double punch stop layers has an excellent punch through ability compared to the CMOSFET having a structure of the single punch stop layer.

Figure 9:
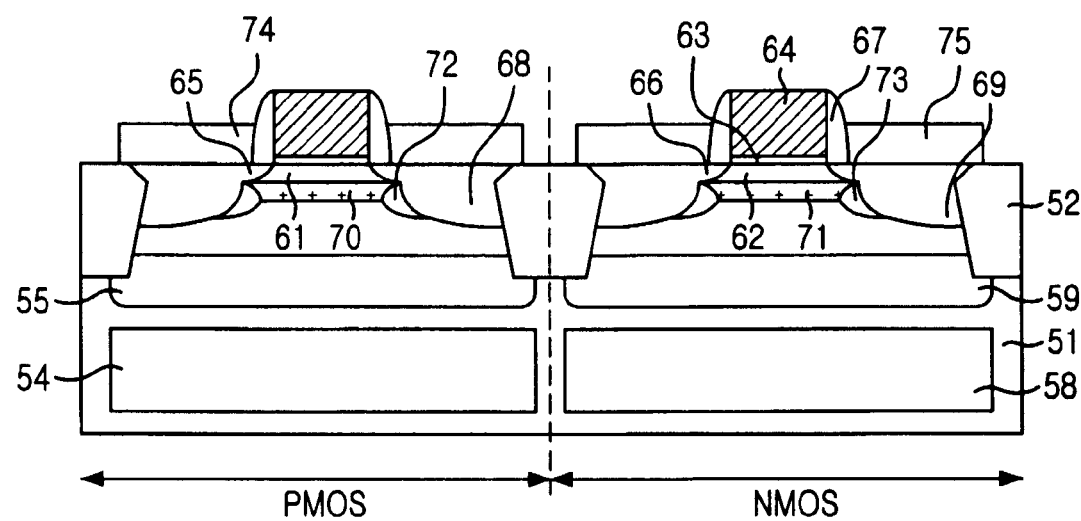
FIG. 9 is a cross-sectional view of the CMOSFET in accordance with a forth preferred embodiment of the present invention.

FIG. 9 is a cross sectional view showing the CMOSFET in accordance with a forth preferred embodiment of the present invention. The CMOSFET structure is basically same as the third preferred embodiment excluding elevated source/drain areas. Hereinafter, the reference numerals used in FIG. 7F and FIG. 8 will be also identically used, and detailed descriptions on the identical parts will be omitted.

As similar to the third preferred embodiment, the pMOS area possesses a structure of double punch stop layers including the first n-type punch stop layer 70 and the second n-type punch stop layer 72, whereas the nMOS area also possesses the structure of double punch stop layers including the first p-type punch stop layer 71 and the second p-type punch stop layer 73. Then, epi-layers get additionally grown on the p+ source/drain area 68 and the n+ source/drain area 69 to form the elevated source/drain areas 74 and 75.

In the forth preferred embodiment illustrated in FIG. 9, the structure of double punch stop layers is established through the decaborane ion implantation and this structure improves the punch through ability. Simultaneously, the forth preferred embodiment has the elevated source/drain structure that suppresses an increase in junction resistance of the source/drain.

FIGS. 10A to 10F are cross-sectional views showing a method for fabricating the CMOSFET in accordance with a fifth preferred embodiment of the present invention.

Figure 10A:
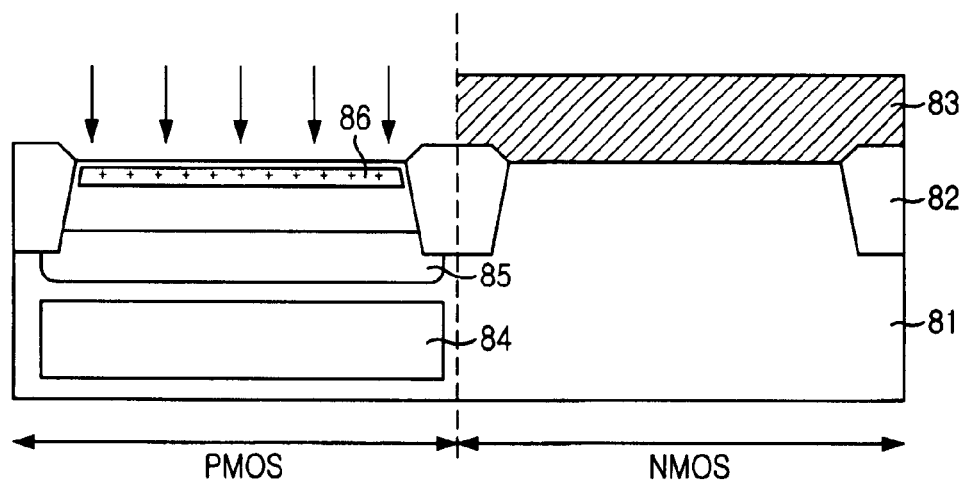
FIGS. 10A to 10F are cross-sectional views showing a method for fabricating the CMOSFET in accordance with a fifth preferred embodiment of the present invention.

Referring to FIG. 10A, a field oxide layer 82 for segregating a device is formed on a predetermined place of a substrate 81 through a STI process or a LOCOS process. Then, a photosensitive film is coated on the substrate 81 and patterned through a photo exposure and a developing process so as to form a first mask 83 that exposes an area for forming a pMOSFET in the substrate 81. Hereinafter, the area for forming the pMOSFET is abbreviated as pMOS area.

Subsequently, the n-type dopant is implanted onto the area of the substrate 81 exposed by the first mask 83 to form a deep n-type well 84 and a continuous ion implantation of the n-type dopant forms a n-type filed stop 85 shallower than the n-type well 84.

The n-type dopant is implanted with energy lower than the ion implantation energy for forming the n-type field stop layer 85 so that a shallow n-type p-channel doping layer 86 is formed with a thickness in a range from about 10 nm to about 50 nm. Herein, phosphorous (P) or arsenic (As) can be used for the n-type dopant.

Figure 10B:
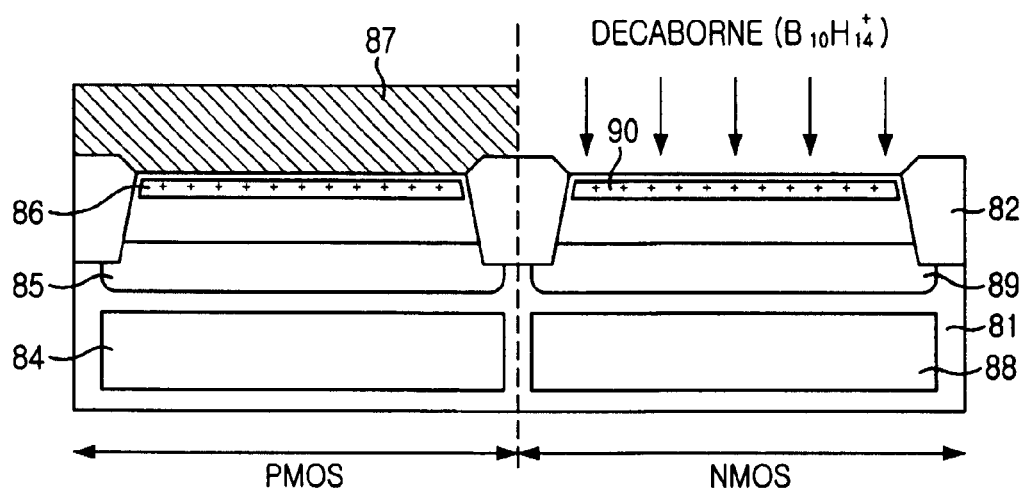

Referring to FIG. 10B, after removing the first mask 83, a photosensitive film is again coated and patterned through the photo exposure process and the developing process to form a second mask 87 that exposes an area in which an nMOSFET of the substrate 81 is formed. This area, hereinafter, will be abbreviated as nMOS area.

Next, the p-type dopant is implanted onto the area of the substrate 81 exposed by the second mask 87 to form a deep p-type well 88 and a continuous ion implantation of the p-type dopant forms a p-type filed stop layer 89 shallower than the p-type well 88.

The decaborane ions are implanted to form a very shallow p-type n-channel doping layer 90 of which thickness is in a range from about 10 nm to about 50 nm measured from a surface of the substrate 81.

Figure 10C:
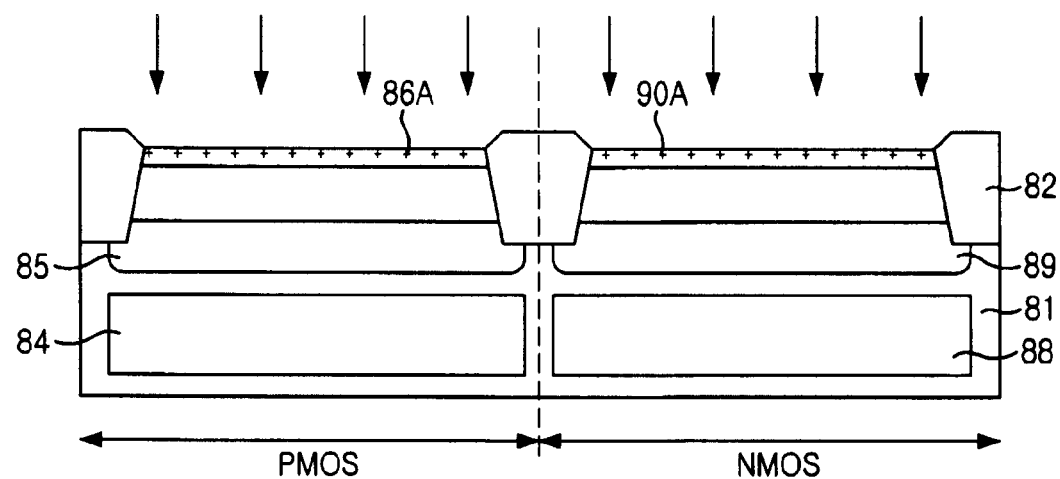

As illustrated in FIG. 10C, after a removal of the second mask 87, such recovery annealing process as RTA process or SRTA process is proceeded at a temperature lower than a melting point of silicon, i.e., 1414° C. to recover a defect in crystals on the surface of the substrate 81 caused by ion bombardments, which occurs during the ion implantation for forming a n-type p-channel doping layer 86 and a p-type n-channel doping layer 90, and allow the implanted dopants to stably bond with closely located silicon atoms in the crystals as simultaneously as to maximally retain diffusions of the dopants.

Preferably, the RTA or the SRTA process is performed at a temperature lower than the melting point of silicon, i.e. 1414° C., by arranging a range of a temperature from about 950° C. to about 1150° C. wherein the recovery of the defect in crystals is possible.

Eventually, each n-type p-channel doping layer 86 and p-type n-channel doping layer 90 becomes a layer with modified characteristics by being recovered with the defect in crystals as well as forming stable bonds between the ion implanted dopants and the silicon in the substrate. Hereinafter, the modified n-type p-channel doping layer 86 and the p-type n-channel doping layer 90 are denoted as 86A and 90A in FIG. 10C.

After the recovery annealing process, a surface treatment process is then performed on the n-type p-channel doping layer 86A and the p-type n-channel doping layer 90A in an atmosphere of hydrogen to eliminate a native oxide layer (not shown) generated during the recovery annealing process. At this time, during the surface treatment process in the atmosphere of hydrogen, hydrogen ($H_2$) reacts with the $SiO_2$ and is evaporated as $H_2O$, thereby eliminating the native oxide layer.

Figure 10D:
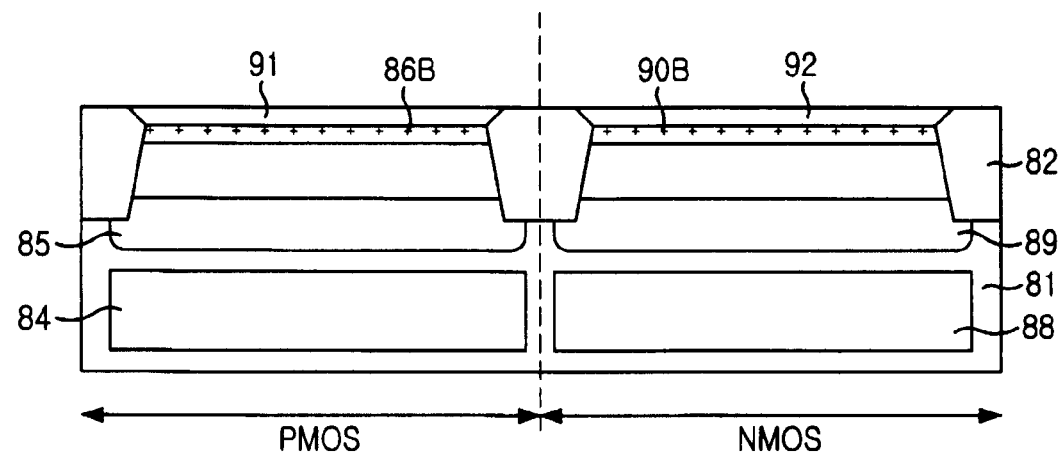

Referring to FIG. 10D, on the substrate 81 eliminated with the native layer, preferably, on each of the n-type p-channel doping layer 86A and the p-type n-channel doping layer 90A, the SEG process is simultaneously applied to get the epi-layers 91 and 92 grown into a thickness in a range from about 5 nm to about 30 nm.

As the above recovery annealing process activates the n-type p-channel doping layer 86A and the p-type n-channel doping layer 90A into a chemically stable and extensively shallow n-type p-channel doping layer 86B and a p-type n-channel doping layer 90B, each of the NMOS area and the pMOS area is established with the SSR epi-channel structure having a δ-doping profile with minimal losses and redistributions of the dopant during the surface treatment process in the atmosphere of hydrogen and the SEG process for the epi-layers 91 and 92.

Figure 10E:
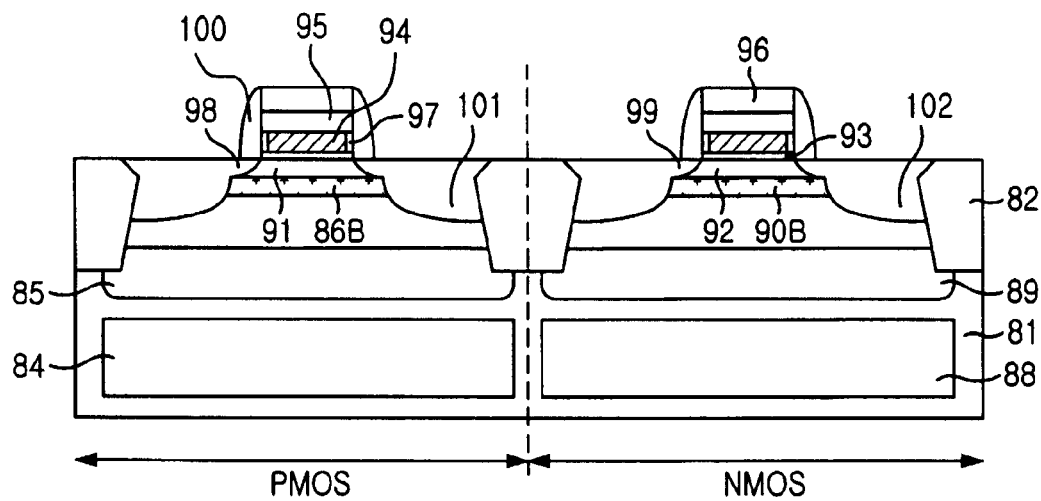

With reference to FIG. 10E, the SSR epi-channel structure, e.g., a gate dielectric layer 93 is formed on the n-type p-channel doping layer 86B and the p-type n-channel doping layer 90B at a temperature ranging from about 650° C. to about 750° C. At this time, the temperature for forming the gate dielectric layer 93 is maintained relatively lower in order to restrain the diffusions of the dopant in the p-type n-channel doping layer 90B.

Accordingly, the gate dielectric layer 93 uses a LTO layer formed at a low temperature, a nitride layer, a high-k dielectric layer or a stacked layer of an oxide layer or a high-k dielectric layer. Since a low thermal budget process is performed for forming the gate dielectric layer 93 at a low temperature, the dopant in the p-type n-channel doping layer 90B is restrained from the diffusion and redistribution, thereby maintaining the SSR doping profile. For example, a silicon thermal oxide layer is formed at a temperature in a range from about 650° C. to about 750° C., and subsequently processed with a nitrogen plasma process or an ammonia plasma process so as to form the silicon oxynitride. Also, the high-k dielectric layer is formed through sequential successive processes of a deposition process carried out at a temperature in a range from about 300° C. to about 650° C. and a subsequent process selected from either a furnace annealing carried out at a temperature in a range from about 400° C. to about 700° C. or a rapid furnace annealing carried out at a temperature in a range from about 600° C. to about 800° C. In case of using the high-k dielectric layer, a maximum temperature is limited to be in a range from about 300° C. to about 700° C. when performing a thermal process for improving layer properties of the high-k dielectric layer.

Next, on the gate dielectric layer 93, a polysilicon layer 94, a metal layer 95 and a hard mask 96 are sequentially stacked. Afterwards, all of the stacked layers are simultaneously patterned through the use of the gate mask (not shown), or the hard mask 96 is first patterned and the metal layer 95 and the polysilicon layer 94 are simultaneously patterned. Through this patterning process, a gate pattern including a gate electrode constructed with the stacked layers of the polysilicon layer 94 and the metal layer 95 and the hard mask 96 is formed.

Herein, the metal layer 95 formed on the polysilicon layer 94 by mainly using tungsten and tungsten silicide is adapted for non-resistance and a high-speed operation of the gate electrode. It is also possible to put a diffusion barrier between the polysilicon layer 94 and the metal layer 95. Additionally, the diffusion barrier uses WN, TiN and so forth.

Next, a gate-reoxidation process is proceeded to recover the gate dielectric layer 93 damaged during an etching process for forming the gate electrode. At this time, after the gate-reoxidation process, lateral sides of the polysilicon layer 94 included in the gate electrode is oxidized until having a predetermined thickness, and the oxides 97 is formed at the lateral sides of the gate electrode. Hereinafter, the oxides formed at the lateral sides of the gate electrode will be abbreviated as lateral wall oxides.

In this case, the gate-reoxidation process is able to recover losses and micro-trenches occurred at the gate dielectric layer 93 when etching the gate electrode. Also, this process oxidizes residues from the etching process remained on a surface of the gate dielectric layer 93 and improves a confidence level by increasing the thickness of the gate dielectric layer 93 located at an edge of the gate electrode.

In case of employing a rapid thermal oxidation (hereinafter referred as to RTO) technique for a thermal oxidation process as like the reoxidation process, a maximum temperature is limited to be in a range from about 750° C. to about 950° C. On the other hand, in case of performing a furnace thermal oxidation process, a maximum temperature is limited to be in a range from about 650° C. to about 800° C. These temperature conditions for both processes are to secure the SSR doping profile from damages, caused by the diffusions of the dopant in the p-type n-channel doping layer 90B due to an excessive thermal process during the gate reoxidation process.

Next, an additional photosensitive mask (not shown) and the gate electrode are used as an ion implantation mask to implant a high dose concentration of the p-type dopant $p^+$ with a low energy onto the pMOS area so as to form a $p^+$ source/drain extension area 98, while a high dose concentration of the n-type dopant $n^+$ with a low energy are implanted onto the nMOS area forming a $n^+$ source/drain extension area 99. At this time, the n-type dopant for forming the $n^+$ source/drain extension area 99 uses P or As, whereas the p-type dopant for forming the $p^+$ source/drain extension area 98 uses boron or boron mixtures.

After depositing an insulation layer for a spacer 100 on a whole surface including the gate electrode and the hard mask 96, the insulation layer is performed with an etchback process so as to form the spacer 100 being positioned to contact with lateral sides of the stacked layers of the gate electrode and the hard mask 96. Herein, the spacer 100 uses a nitride layer or an oxide layer.

Subsequently, the pMOS are is ion implanted with a high dose concentration of the p-type dopant, e.g., boron or boron mixtures by using an additional photosensitive film mask or the gate electrode and the spacer 100 so as to form a $p^+$ source/drain area 101 electrically connected to the $p^+$ source/drain extension area 98. On the other hand, the nMOS area is ion implanted with a high dose concentration of the n-type dopant, e.g., P or As to form an $n^+$ source/drain area 102 electrically connected to the $n^+$ source/drain extension area 99. At this time, each ion implantation depth of the $n^+$ source/drain area 102 and the $p^+$ source/drain area 101 is deeper than that of the $n^+$ source/drain extension area 99 and the $p^+$ source/drain extension area 98, respectively.

Figure 10F:
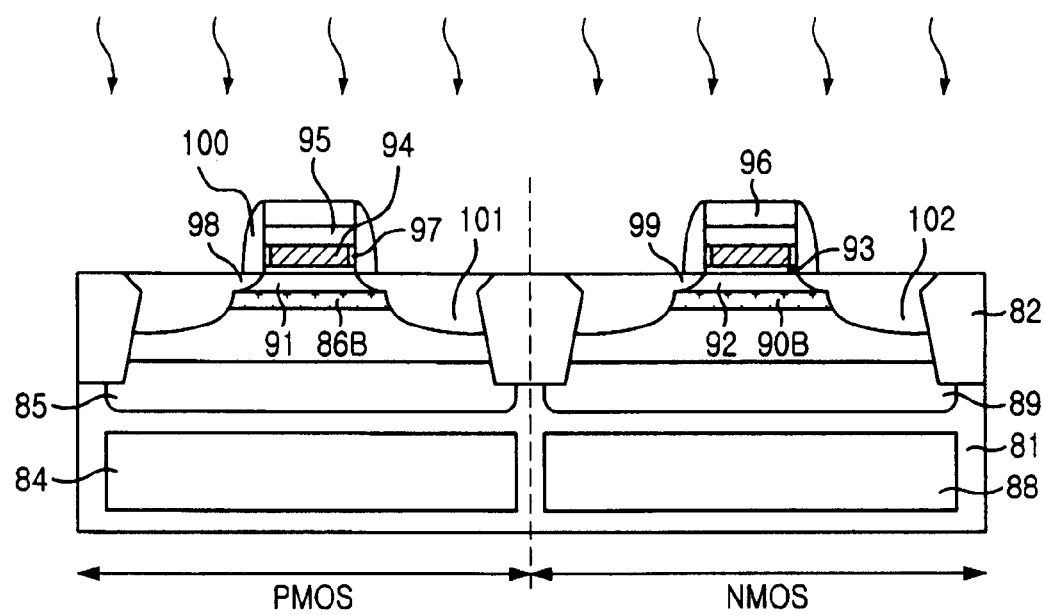

As depicted in FIG. 10F, an activation annealing process is performed to electrically activate the dopants of the $n^+$ source/drain area 102, the $n^+$ source/drain extension area 99, the $p^+$ source/drain area 101 and the $p^+$ source/drain extension area 98. Particularly, the active annealing process is operated at a temperature wherein diffusions of the p-type n-channel doping layer 90B and a deepening of a junction depth of the $p^+$ source/drain extension area 98 are simultaneously restrained.

Preferably, the activation annealing process is selected among the RTA performed at a temperature in a range from about 600° C. to about 1000° C., the furnace annealing performed at a temperature ranging from about 300° C. to about 750° C. and the SRTA performed at a temperature in a range from about 600° C. to about 1100° C.

As described above, if the gate-reoxidation, the gate electrode, the $p^+$ source/drain extension area 98, the $n^+$ source/drain extension area 99, the $p^+$ source/drain area 101 and the $n^+$ source/drain area 102 are formed through the low thermal process having a low thermal budget, it is possible to maintain the SSR epi-channel structure restrained with the diffusion of the dopants.

In the above fifth preferred embodiment, the n-type p-channel doping layer 86B and the p-type n-channel doping layer 90B simultaneously function as a punch stop layer for controlling a short channel effect. Also, each maximum doping depth of the n-type p-channel doping layer 86B and the p-type n-channel doping layer 90B is set to be lower than each junction depth of the $p^+$ source/drain area 101 and the $n^+$ source/drain area 102 so that junction capacitances with respect to each $p^+$-n and $n^+$-p junctions and junction leakage currents are decreased.

Figure 11:
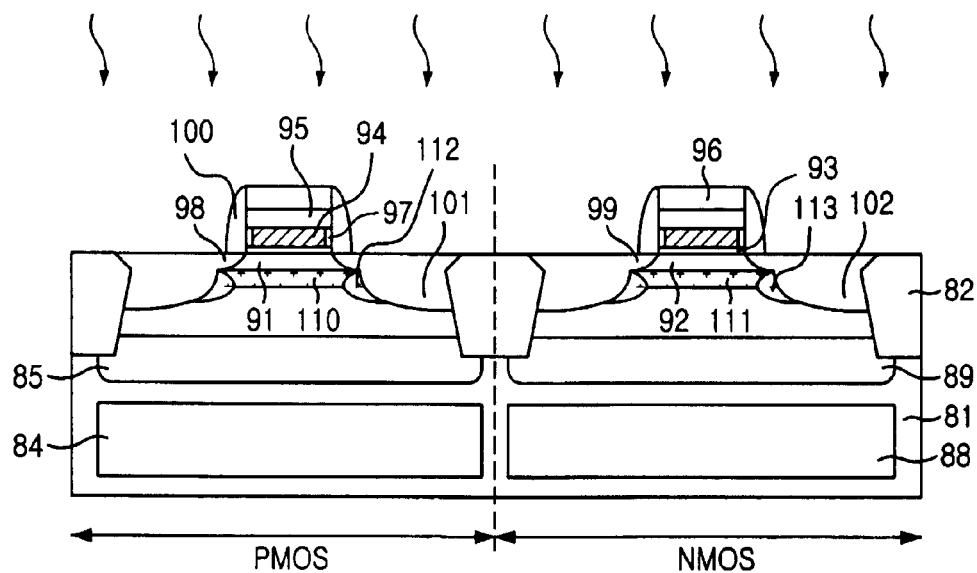
FIG. 11 is a cross-sectional view depicting the CMOSFET in accordance with a sixth preferred embodiment of the present invention.

FIG. 11 is a cross-sectional view illustrating the CMOSFET structure in accordance with a sixth preferred embodiment. The CMOSFET structures of FIG. 11 and the fifth preferred embodiment are identical except for a first n-type punch stop layer 110, a second n-type punch stop layer 112, a first p-type punch stop layer 111 and a second p-type punch stop layer 113. Hereinafter, the same reference numerals used in FIG. 10F will be used, and descriptions on the same parts will also be omitted.

As similar to the fifth preferred embodiment, the pMOS area is established with the epi-channel structure including the first n-type punch stop layer 110 ion implanted with P or As and an epi-layer 91 grown on the first n-type punch stop layer 110, whereas the nMOS area is established with another epi-channel structure including the first p-type punch stop layer 111 ion implanted with the decaborane ions and an epi-layer 92 grown on the first p-type punch stop layer 111.

Furthermore, on a bottom of the $p^+$ source/drain extension area 98 and the $n^+$ source/drain extension area 99, the second n-type punch stop layer 112 and the second p-type punch stop layer 113 are formed. At this time, the second n-type punch stop layer 112 is formed by implanting the same n-type dopant such as P or As used for the first n-type punch stop layer 110. Instead of implanting the decaborane ions as used in forming the first p-type punch stop layer 111, boron or boron mixtures are used for forming the second p-type punch stop layer 113.

Herein, the dopants are ion implanted prior to forming the $p^+$ source/drain area 101 and the $n^+$ source/drain area 102 to form the second n-type punch stop layer 112 and the second p-type punch stop layer 113 at the bottom of the $p^+$ source/drain extension area 98 and the $n^+$ source/drain extension area 99, respectively.

The second p-type punch stop layer 113 and the second n-type punch stop layer 112 simultaneously function as a channel doping layer and a punch stop layer for controlling a short channel effect.

In the end, the CMOSFET in accordance with the sixth preferred embodiment of the present invention has a double punch stop layer structure. The CMOSFET having the double punch stop layer structure has an excellent property in punch through compared to a single punch stop layer structure.

Figure 12:
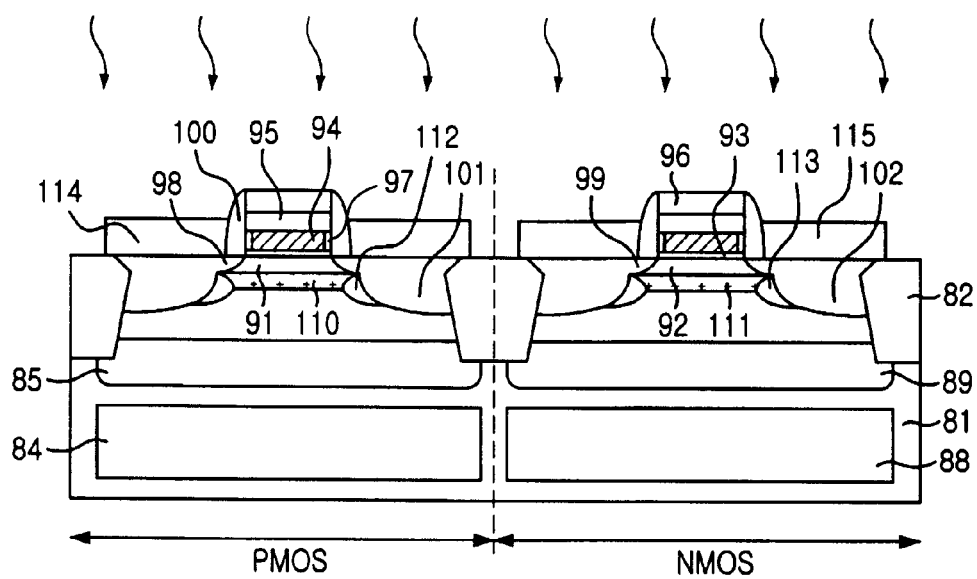
FIG. 12 is a cross sectional view showing the CMOSFET in accordance with a seventh preferred embodiment of the present invention.

FIG. 12 is a cross-sectional view showing the CMOSFET structure in accordance with a seventh preferred embodiment. Also, the CMOSFET structure in FIG. 12 is identical to the sixth preferred embodiment except for elevated source/drain areas. Hereinafter, the same reference numerals used in FIGS. 10F and 11 will be used, and descriptions on the same parts will also be omitted.

Referring to FIG. 12, as similar to the sixth preferred embodiment, the pMOS area has a structure of the double punch stop layers including the first n-type punch stop layer 110 and the second n-type punch stop layer 112, whereas the nMOS area has a structure of the double punch stop layers including the first p-type punch stop layer 111 and the second p-type punch stop layer 113. Also, on the $p^+$ source/drain area 101 and the $n^+$ source/drain area 102, epi-layers are additionally grown to form elevated source/drain areas 114 and 115.

The seventh preferred embodiment of the present invention also possesses the double punch stop layer structure formed through the decaborane ion implantation. As mentioned before, this structure enhances the punch-through property. At the same time, the embodiment also includes the elevated source/drain areas that suppress an increase in junction resistance of the source/drain.

During the fabrication of the nMOSFET and CMOSFET in accordance with first to seventh preferred embodiments of the present invention, a maximum temperature of the RTA is limited to be in a range from about 600° C. to about 1000° C., and a subsequent SRTA has also a limited maximum temperature ranging from about 600° C. to about 1100° C. and the furnace annealing has a maximum temperature limited to be in a range from about 300° C. to about 750° C. As seen from the above, the RTA, SRTA and furnace annealing processes are low thermal processes to secure the SSR doping profile from damages, caused by the diffusions of the dopants of the doping layers occurring due to an excessive thermal process while performing subsequent processes after the formation of the SSR epi-channel structure.

Although the first to seventh preferred embodiments of the present invention describe a semiconductor device with the source/drain extension area, they are applicable for fabricating a semiconductor device with a common lightly doped drain (LDD) structure.

By following the above preferred embodiments of the present invention, it is possible to establish an ultra shallow SSR epi-channel structure with a δ-doping profile. Therefore, a junction capacitance of a device of which channel length is less than 100 nm is reduced as well.

It is also possible to fabricate a highly functioned semiconductor device with a reduced cost because of an enhanced yield compared to the SSR doping method through a boron ion implantation with a low energy. Moreover, the present invention provides such effects in controlling a gate voltage variation due to a random dopant inducement (RDI) as simultaneously as in improving manufacturing yields by controlling a short channel effect from a channel of which gate length is less than 100 nm.

In addition, a dopant concentration at an area of a channel surface can be decreased up to 1/10 of a maximum concentration of a channel doping layer. Hence, surface mobility and a driving current characteristic can be improved.

Lastly, a simple and easy construction of the ultra shallow SSR channel provides further establishments of a device consuming a low voltage and power.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device with ultra shallow super-steep-retrograde (hereinafter referred as to SSR) epi-channel, comprising the steps of:
    forming a channel doping layer below a surface of a semiconductor substrate by implanting decaborane;
    forming an epi-layer on the channel doping layer;
    forming sequentially a gate dielectric layer and a gate electrode on the epi-layer;
    forming source/drain extension areas shallower than the channel doping layer by being aligned at edges of the gate electrode;
    forming a spacers on lateral sides of the gate electrode; and
    forming source/drain areas deeper than the channel doping layer by being aligned at edges of the spacer through ion implantation onto the substrate.

2. The method as recited in claim 1, wherein the formation of the channel doping layer is followed by the steps of:
    performing an annealing process at a temperature lower than a melting point of the substrate; and
    performing a surface treatment process in an atmosphere of hydrogen to remove a native oxide layer of the channel doping layer.

3. The method as recited in claim 2, wherein the annealing process is performed with a rapid thermal annealing process or a spike rapid thermal annealing process.

4. The method as recited in claim 1, further comprising a step of forming selectively an elevated source/drain areas on the source/drain areas.

5. The method as recited in claim 1, further comprising the step of forming an activation annealing process at a temperature that simultaneously suppress the diffusion of the channel doping layer and the deepening in the junction depth of the source/drain area, after the step of forming the source/drain area.

6. The method as recited in claim 5, wherein the activation annealing process is selected among a rapid thermal annealing process performed at a temperature in a range from about 600° C. to about 1000° C., a furnace annealing process performed at a temperature in a range from about 300° C. to about 750° C. or a spike rapid thermal annealing process performed at a temperature in a range from about 600° C. to about 1100° C.

7. The method as recited in claim 1, wherein the channel doping layer has a thickness ranging from about 10 nm to about 50 nm.

8. The method as recited in claim 1, wherein the epi-layer is formed till having a thickness in a range from about 5 nm to about 30 nm.

9. A method for fabricating a semiconductor device with ultra shallow super-steep-retrograde (hereinafter referred as to SSR) epi-channel comprising the steps of:

forming a well in semiconductive substrate;

forming a first punch stop doping layer by implanting decaborane ions below a surface of above the well;

performing a first annealing process at a temperature lower than a melting point of the substrate;

forming an epi-layer on the punch stop doping layer;

forming sequentially a gate dielectric layer and a gate electrode on the epi-layer;

forming a first source/drain area aligning at both edges of the gate electrode;

forming a second punch stop doping layer below the first source/drain area by implanting the same dopant in the well;

forming a second source/drain area connected to the first source/drain area and deeper than the first source/drain area; and performing a second annealing process for the purpose of activation of dopants in the first and the second source/drain area at a temperature suppressing the diffusions of the channel doping layer.

10. The method as recited in claim 9, further comprising the step of forming a conductive field stop doping layer on the well after the step of forming the well, wherein the dopant for field stop doping layer is the same in the well.

11. The method as recited in claim 9, wherein the first annealing process is selected among rapid thermal annealing process or spike rapid thermal annealing process.

12. The method as recited in claim 9, wherein the second annealing process is selected among rapid thermal annealing process performed at a temperature in a range from about 600° C. to about 1000° C., furnace annealing process performed at a temperature in a range from about 300° C. to about 750° C. or spike rapid thermal annealing process performed at a temperature in a range from about 600° C. to about 1100° C.

13. The method as recited in claim 1, wherein the step of forming sequentially the gate dielectric layer and the gate electrode includes the step of reoxidizing after forming the gate electrode pattern by etching.

14. The method as recited in claim 13, wherein the reoxidation step is performed with a rapid thermal oxidation technique of which maximum temperature is limited to be in a range from about 750° C. to about 950° C.

15. The method as recited in claim 13, wherein the reoxidation step is performed with a furnace thermal oxidation of which maximum temperature is limited to be in a range from about 650° C. to about 800° C.

16. The method as recited in claim 1, wherein the gate dielectric layer is formed any one selected from a group of silicon thermal oxide -layer, a nitrided silicon oxide layer, a high-k dielectric layer or a stacked layer of a silicon thermal oxide layer and a high-k dielectric layer.

17. The method as recited in claim 16, wherein the silicon thermal oxide layer is formed at a temperature in a range from about 650° C. to about 750° C., and wherein the nitrided silicon oxide layer is formed at a temperature in a range from about 650° C. to about 750° C. and subsequently processed with nitrogen plasma or ammonia plasma process to form the nitrided silicon oxide layer, and wherein the high-k dielectric layer is formed through a deposition process carried out at a temperature in a range from about 300° C. to about 650° C. and a subsequent process selected from either a furnace annealing process carried out at a temperature in a range from about 400° C. to about 700° C. or a rapid thermal annealing process carried out at a temperature from about 600C° C. to about 800° C.

18. The method as recited in claim 9, wherein the selective epitaxial growth on the second source/drain areas is performed to form a third source/drain area.

19. The method as recited in claim 9, wherein the step of forming sequentially the gate dielectric layer and the gate electrode includes the step of reoxidizing after forming the gate electrode pattern by etching.

20. The method as recited in claim 9, wherein the gate dielectric layer is formed any one selected from a group of silicon thermal oxide layer, a nitrided silicon oxide layer, a high-k dielectric layer or a stacked layer of a silicon thermal oxide layer and a high-k dielectric layer.

* * * * *